United States Patent
Tawarazako et al.

(10) Patent No.: US 10,730,755 B2
(45) Date of Patent: *Aug. 4, 2020

(54) SILICA-BASED COMPOSITE FINE-PARTICLE DISPERSION, METHOD FOR PRODUCING SAME, AND POLISHING SLURRY INCLUDING SILICA-BASED COMPOSITE FINE-PARTICLE DISPERSION

(71) Applicant: JGC Catalysts and Chemicals Ltd., Kawasaki-shi (JP)

(72) Inventors: Yuji Tawarazako, Kitakyushu (JP); Yoshinori Wakamiya, Kitakyushu (JP); Shingo Kashiwada, Kitakyushu (JP); Kazuaki Inoue, Kitakyushu (JP); Kazuhiro Nakayama, Kitakyushu (JP); Michio Komatsu, Kitakyushu (JP)

(73) Assignee: JGC Catalysts and Chemicals Ltd., Kawasaki-shi (JP)

( * ) Notice: Subject to any disclaimer, the term of this patent is extended or adjusted under 35 U.S.C. 154(b) by 30 days.

This patent is subject to a terminal disclaimer.

(21) Appl. No.: 15/561,696

(22) PCT Filed: Mar. 30, 2016

(86) PCT No.: PCT/JP2016/060535
§ 371 (c)(1),
(2) Date: Sep. 26, 2017

(87) PCT Pub. No.: WO2016/159167
PCT Pub. Date: Oct. 6, 2016

(65) Prior Publication Data
US 2018/0105428 A1    Apr. 19, 2018

(30) Foreign Application Priority Data

Mar. 31, 2015 (JP) ................................ 2015-071044
Sep. 17, 2015 (JP) ................................ 2015-183942

(51) Int. Cl.
*C09G 1/02* (2006.01)
*C01B 33/149* (2006.01)
(Continued)

(52) U.S. Cl.
CPC ............ *C01B 33/149* (2013.01); *B24B 37/00* (2013.01); *C01B 33/12* (2013.01);
(Continued)

(58) Field of Classification Search
None
See application file for complete search history.

(56) References Cited

U.S. PATENT DOCUMENTS 5,938,837 A    8/1999  Hanawa et al.
6,645,265 B1 * 11/2003  Wang .................... C03C 19/00
                                                        106/3

(Continued)

FOREIGN PATENT DOCUMENTS

CN    101611110 A    12/2009
JP    2746861 B2      2/1998
(Continued)

OTHER PUBLICATIONS

Song et al. "Synthesis of CeO2-coated SiO2 nanoparticle and dispersion stability of its suspension" Materials Chemistry and Physics 2008, 110, 128-135. (Year: 2008).*

(Continued)

*Primary Examiner* — Robert S Loewe
(74) *Attorney, Agent, or Firm* — The Webb Law Firm

(57) ABSTRACT

A subject of this invention is to provide a dispersion liquid of a silica-based composite particle, which can rapidly polish silica film, Si wafer or even hard-to-process material, can concurrently achieve high surface accuracy (less scratches, etc.), and can suitably be used for surface polishing of semiconductor devices including semiconductor sub- (Continued)

strate and wiring board, by virtue of its impurity-free nature. The subject is solved by a dispersion liquid of a silica-based composite particle that contains a silica-based composite particle that has a core particle mainly composed of amorphous silica, and bound thereto a ceria particle mainly composed of crystalline ceria, further has a silica film that covers them.

14 Claims, 7 Drawing Sheets

(51) Int. Cl.
| | |
|---|---|
| *B24B 37/00* | (2012.01) |
| *H01L 21/304* | (2006.01) |
| *C09K 3/14* | (2006.01) |
| *C01B 33/12* | (2006.01) |
| *C01F 17/32* | (2020.01) |
| *C01B 33/141* | (2006.01) |

(52) U.S. Cl.
CPC .......... *C01B 33/1417* (2013.01); *C01F 17/32* (2020.01); *C09G 1/02* (2013.01); *C09K 3/14* (2013.01); *C09K 3/1436* (2013.01); *C09K 3/1463* (2013.01); *H01L 21/304* (2013.01)

(56) References Cited

U.S. PATENT DOCUMENTS

| | | |
|---|---|---|
| 6,855,635 B2 | 2/2005 | Schumacher et al. |
| 2002/0003225 A1 | 1/2002 | Hampden-Smith et al. |
| 2002/0177311 A1 | 11/2002 | Schumacher et al. |
| 2003/0118824 A1* | 6/2003 | Tokarz ................... B82Y 30/00 428/404 |
| 2008/0242090 A1 | 10/2008 | Yamada et al. |
| 2010/0102268 A1 | 4/2010 | Kroell et al. |
| 2012/0077419 A1* | 3/2012 | Zhang .................. C09K 3/1436 451/36 |
| 2012/0299158 A1* | 11/2012 | Shinoda .................... C09G 1/02 257/618 |
| 2016/0177155 A1* | 6/2016 | Nakamura .............. B24B 37/00 252/79.1 |

FOREIGN PATENT DOCUMENTS

| | | | | |
|---|---|---|---|---|
| JP | 2002356312 A | 12/2002 | | |
| JP | 2009212378 A | 9/2009 | | |
| JP | 201211525 A | 1/2012 | | |
| JP | 2013119131 A | * 6/2013 | ............ | B24B 37/00 |
| JP | 2013119131 A | 6/2013 | | |
| JP | 201684243 A | 5/2016 | | |
| KR | 10-2005-0034913 | 4/2005 | | |
| WO | 2005/035688 A1 | 4/2005 | | |

OTHER PUBLICATIONS

Zhang et al. "Synthesis, characterization of ceria-coated silica particles and their chemical mechanical polishing performance onf glass substrate" Applied Surface Science, 2010, 257, 1750-1755. (Year: 2010).*

Lei et al. "Preparation of silica/ceria nano composite abrasive and its CMP behavior on hard disk substrate" Microelectronic Engineering 2010, 87, 1747-1750. (Year: 2010).*

Zhao et al. "Synthesis, characterization of CeO2©SiO2 nanoparticles and their oxide CMP behavior". Microelectronic Engineering 2010, 87, 1716-1720. (Year: 2010).*

Khalil et al. "Formation and characterization of different ceria/silica composite materials via dispersion of ceria gel of soluble ceria precursors in silica sols" Journal of Colloid and Interface Science 2005, 287, 534-541. (Year: 2005).*

Machine translation for JP-2013119131, translation generated Jan. 2019, 15 pages. (Year: 2019).*

Lee, Seung-Ho, et al., "Chemical mechanical polishing of thermal oxide films using silica particles coated with ceria", Journal of Materials Research, Oct. 2002, pp. 2744-2749, vol. 17, No. 10, Materials Research Society.

Lin, F, et al., "A Study of the Colloidal Stability of Mixed Abrasive Slurries and Their Role in CMP", Journal of Electrochemical Society, 2012, pp. H482-H489, vol. 159, No. 5, The Electrochemical Society, Canada.

* cited by examiner (a)

(b)

(a)

(b)

SILICA-BASED COMPOSITE FINE-PARTICLE DISPERSION, METHOD FOR PRODUCING SAME, AND POLISHING SLURRY INCLUDING SILICA-BASED COMPOSITE FINE-PARTICLE DISPERSION

CROSS-REFERENCE TO RELATED APPLICATIONS

This application is the United States national phase of International Application No. PCT/JP2016/060535 filed Mar. 30, 2016, and claims priority to Japanese Patent Application Nos. 2015-071044 and 2015-183942, filed Mar. 31, 2015 and Sep. 17, 2015, respectively, the disclosures of which are hereby incorporated in their entirety by reference.

TECHNICAL FIELD

This invention relates to a dispersion liquid of a silica-based composite particle suitable as an abrasive used for manufacturing semiconductor devices, and in particular to a dispersion liquid of a silica-based composite particle used for planarizing, by chemical mechanical polishing (CMP), a film to be polished formed on a substrate; a method of manufacturing the same; and a polishing slurry containing such dispersion liquid of a silica-based composite particle.

BACKGROUND ART

Semiconductor devices including semiconductor substrate and wiring board have been enhanced their performances in pursuit of higher degrees of integration and micronization. Manufacturing processes for such semiconductor devices have adopted so-called chemical mechanical polishing (CMP), which has become indispensable typically for forming a shallow trench isolation, planarizing an insulation interlayer, and forming a contact plug or Cu damascene interconnect.

The CMP abrasive is typically composed of an abrasive grain and a chemical component, wherein the chemical component plays a role of promoting polishing through oxidation or corrosion of a film to be polished. Meanwhile, the abrasive grain plays a role of polishing based on mechanical action, for which the colloidal silica, fumed silica, or ceria particle is used. In particular, the ceria particle, capable of demonstrating a specifically high polishing rate on a silicon oxide film, has been applied to polishing in the shallow trench isolation process.

In the shallow trench isolation process, not only the silicon oxide film, but also silicon nitride film is polished. For easy isolation, the polishing rate of the silicon oxide film is preferably higher, and the polishing rate of the silicon nitride film is preferably lower, wherein the ratio of these polishing rates (selectivity) is also important.

In one conventional method of polishing these members, relatively coarse primary polishing is followed by fine secondary polishing, to thereby obtain a smooth surface or an extremely precise surface with less scratches or other flaws.

In relation to the abrasive used for the secondary polishing as this sort of finish polishing, the methods below have typically been proposed.

For example, Patent Literature 1 describes a method of manufacturing a ultrafine cerium oxide particle (average particle size=10 to 80 nm) composed of cerium oxide single crystal, obtained by mixing an aqueous cerium(III) nitrate solution and a base according to a quantity ratio capable of adjusting pH to 5 to 10, rapidly heating the mixture up to 70 to 100° C., and ripening the mixture at that temperature. The literature also describes that the manufacturing method can provide the ultrafine cerium oxide particle with high levels of particle size uniformity and particle shape uniformity.

Non-Patent Literature 1 discloses a method of manufacturing ceria-coated silica, containing a manufacturing process similar to the method of manufacturing the ultrafine cerium oxide particle described in Patent Literature 1. The method of manufacturing ceria-coated silica does not have calcination and dispersion processes which were contained in the method of manufacturing described in Patent Literature 1.

Patent Literature 2 describes a silica-based composite particle that includes amorphous silica particle A, having thereon crystalline oxide layer B that contains one or more elements selected from zirconium, titanium, iron, manganese, zinc, cerium, yttrium, calcium, magnesium, fluorine, lanthanum and strontium. The literature also describes, as one preferred embodiment, a silica-based composite particle that includes amorphous silica particle A; having on the surface thereof oxide layer C that is an amorphous oxide layer but different from the amorphous silica layer, and containing aluminum or other element; and having further thereon crystalline oxide layer B that contains one or more elements selected from zirconium, titanium, iron, manganese, zinc, cerium, yttrium, calcium, magnesium, fluorine, lanthanum and strontium. According to the description, with the crystalline oxide layer B provided to the surface of amorphous silica particle A, the silica-based composite particle can improve the polishing rate; pretreatment of the silica particle contributes to suppress the particles from being sintered during calcination, and to improve the dispersibility in a polishing slurry; and absence or largely reduced amount of consumption of cerium oxide enables provision of an abrasive with a high polishing performance at low cost. It is also described that, the composite particle, having such additional amorphous oxide layer C between silica-based particle A and oxide layer B, shows particularly strong effects of suppressing sintering of particles and of improving the polishing rate.

CITATION LIST

Patent Literature

[Patent Literature 1] JP-B2-2746861
[Patent Literature 2] JP-A-2013-119131

Non-Patent Literature

[Non-Patent Literature 1] Seung-Ho Lee, Zhenyu Lu, S. V. Babu and Egon Matijevic, "Chemical mechanical polishing of thermal oxide films using silica particles coated with ceria", Journal of Materials Research, Volume 17, Issue 10, 2002, pp 2744-2749

The present inventors actually manufactured the ultrafine cerium oxide particle described in Patent Literature 1 and examined it, and found that the particle could give only a low polishing rate, and was likely to produce defects on the surface of a base to be polished (degraded surface accuracy, increased scratches, and abrasive residue remained on the surface of a base to be polished).

The present inventors presume that this is mainly because the method of manufacturing a ultrafine cerium oxide particle described in Patent Literature 1, having no calcination process but only allowing the cerium oxide particle to crystallize from the liquid phase (aqueous solution containing cerium(III) nitrate), can produce the cerium oxide particle with a relatively low degree of crystallinity, as compared with the ceria particle yielded from the manufacturing method involving the calcination process (crystallinity of ceria particle can be increased by calcination), and also because the uncalcined cerium oxide does not adhere to core particle, but can remain on the surface of the base to be polished.

The ceria-coated silica described in Non-Patent Literature 1, not having been calcined, is considered to achieve only a low polishing rate in practice, and is anticipated to leave particle residue on the surface of the base to be polished.

The present inventors further found that the silica-based composite particle having oxide layer C as described in Patent Literature 2, when used for polishing, may leave impurities such as aluminum on the surface of the semiconductor device and may adversely affect semiconductor devices.

SUMMARY OF THE INVENTION

This invention is aimed to solve the problems described above. That is, this invention is aimed to provide a dispersion liquid of a silica-based composite particle, which can rapidly polish silica film, Si wafer or even hard-to-process material, can concurrently achieve high surface accuracy (less scratches, less residual abrasive grain on substrate, improved Ra value of substrate, etc.), and can suitably be used for surface polishing of semiconductor devices including semiconductor substrate and wiring board, by virtue of its impurity-free nature; a method of manufacturing the same; and a polishing slurry containing such dispersion liquid of a silica-based composite particle.

Solution to Problem

The present inventors went through extensive investigations to reach this invention.

This invention includes (1) to (9) below.

(1) A dispersion liquid of a silica-based composite particle, containing a silica-based composite particle that has a core particle mainly composed of amorphous silica, and bound thereto a ceria particle mainly composed of crystalline ceria, the ceria particle further having on the surface thereof a silica film, the silica-based composite particle having an average particle size of 50 to 350 nm, and having features [1] to [3] below:

[1] the silica-based composite particle has a mass ratio of silica and ceria of 100:11 to 316;
[2] the silica-based composite particle when measured by X-ray diffractometry allows detection of a crystal phase of ceria only; and
[3] the silica-based composite particle when measured by X-ray diffractometry is found to have a crystallite size of crystalline ceria on the (111) plane of 10 to 25 nm.

(2) The dispersion liquid of a silica-based composite particle of (1), wherein the silica-based composite particle, when determined by EDS measurement that selectively irradiates electron beam on the silica film observable under a transmission electron microscope, is found to have a ratio of Si atomic percentage relative to Ce atomic percentage (Si atomic percentage/Ce atomic percentage) of 0.9 or larger.

(3) The dispersion liquid of a silica-based composite particle of (1) or (2), wherein the silica-based composite particle contains impurities whose content rates satisfy (a) and (b) below:

(a) the content rate of each of Na, Ag, Al, Ca, Cr, Cu, Fe, K, Mg, Ni, Ti, Zn and Zr is 100 ppm or below; and
(b) the content rate of each of U, Th, Cl, $NO_3$, $SO_4$ and F is 5 ppm or below.

(4) The dispersion liquid of a silica-based composite particle of any one of (1) to (3), designed to give a streaming potential curve when subjected to cation colloidal titration, from which ratio ($\Delta PCD/V$) of the amount of change of streaming potential ($\Delta PCD$), and the amount of consumption (V) of a cation colloidal titrant at a knick, given by Equation (1) below, is determined to be −110.0 to −15.0:

$$\Delta PCD/V = (I-C)/V \qquad \text{Equation (1)}$$

where,
C: streaming potential (mV) at knick; and
I: streaming potential (mV) at start point of streaming potential curve; and
V: amount of consumption (ml) of cation colloidal titrant at knick.

(5) The dispersion liquid of a silica-based composite particle of any one of (1) to (4), showing a negative streaming potential before being titrated, when kept within the range from pH3 to 8.

(6) A polishing slurry comprising the dispersion liquid of a silica-based composite particle described in any one of (1) to (5).

(7) The polishing slurry of (6), designed to be used for planarizing a semiconductor substrate having a silica film formed thereon.

(8) A method of manufacturing a dispersion liquid of a silica-based composite particle, the method comprising Step 1 to Step 3 below:

Step 1: keeping a silica particle dispersion liquid, having a silica particle dispersed in a solvent, stirred at a temperature of 5 to 98° C., and at a pH of 7.0 to 9.0, and adding thereto a metal cerium salt in a continuous or intermittent manner, to thereby obtain a precursor particle dispersion liquid containing a precursor particle;

Step 2: drying the precursor particle dispersion liquid, followed by calcination at 400 to 1,200° C., subjecting the obtained calcined product to treatment (i) or (ii) below, to thereby obtain a dispersion liquid of the disintegrated calcined product:
  (i) dry disintegration/grinding, followed by addition of a solvent for solvent dispersion; or
  (ii) wet disintegration/grinding under addition of a solvent, conducted at pH8.6 to 10.8,
and,
Step 3: centrifuging the dispersion liquid of the disintegrated calcined product at a relative centrifugal acceleration of 300 G or larger, and removing a precipitated component, to thereby obtain a dispersion liquid of a silica-based composite particle.

(9) The method of manufacturing a dispersion liquid of a silica-based composite particle of (8), wherein the silica-based composite particle contains impurities whose content rates satisfy (a) and (b) below:

(a) the content rate of each of Na, Ag, Al, Ca, Cr, Cu, Fe, K, Mg, Ni, Ti, Zn and Zr is 100 ppm or below; and
(b) the content rate of each of U, Th, Cl, $NO_3$, $SO_4$ and F is 5 ppm or below.

Advantageous Effects of Invention

According to this invention, there are provided a dispersion liquid of a silica-based composite particle, which can rapidly polish silica film, Si wafer or even hard-to-process materials, can concurrently achieve high surface accuracy (less scratches, small surface roughness (Ra) of polished substrate, etc.), and can suitably be used for surface polishing of semiconductor devices including semiconductor substrate and wiring board, by virtue of its impurity-free nature; a method of manufacturing the same; and a polishing slurry containing such dispersion liquid of a silica-based composite particle.

The dispersion liquid of a silica-based composite particle of this invention is effective to polishing of the surface of semiconductor devices, and in particular polishing of substrate having formed thereon a silica insulating film.

DETAILED DESCRIPTION OF EMBODIMENTS

Figure 1:
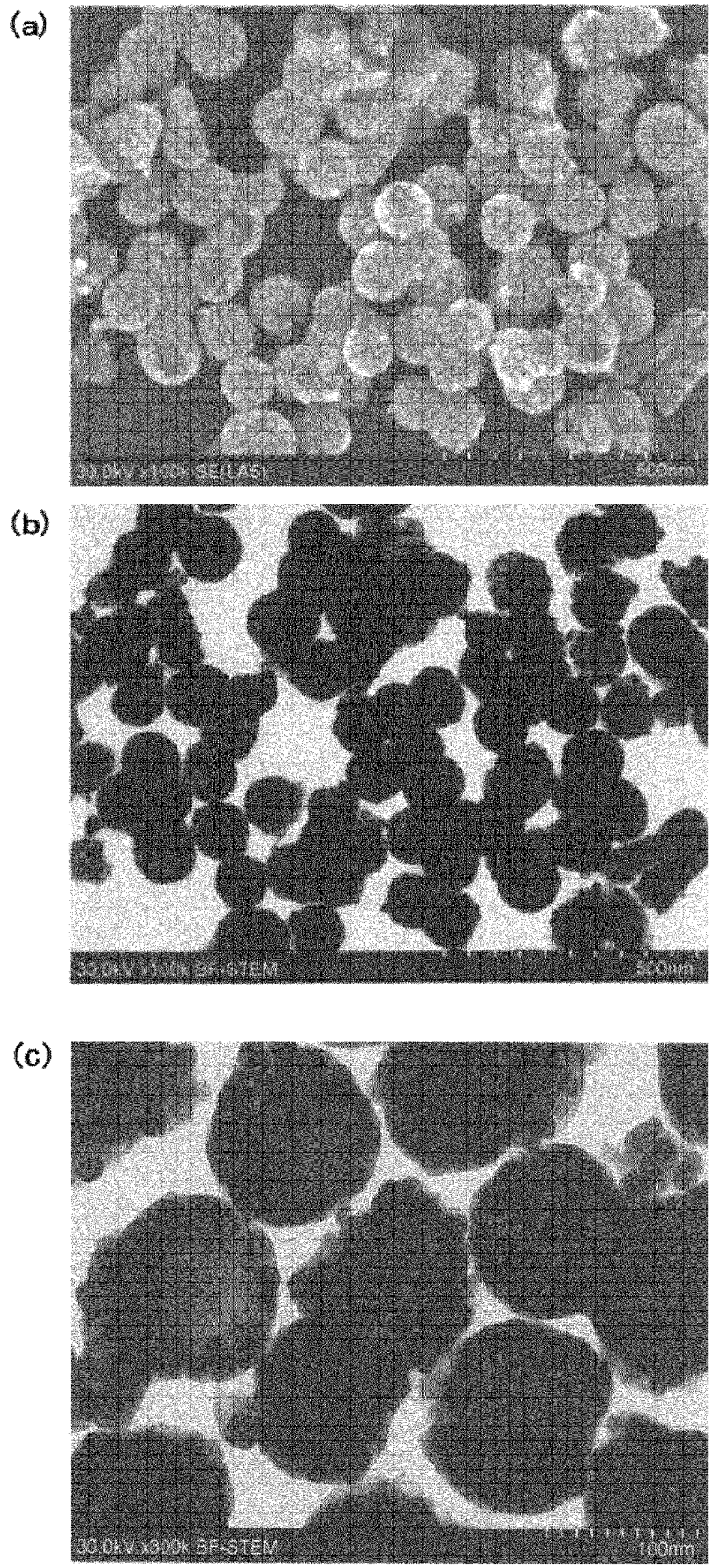
FIG. 1(a) is a SEM image obtained in Example 1, and FIGS. 1(b) and (c) are TEM images obtained in Example 1.

This invention will be explained.

This invention relates to a dispersion liquid of a silica-based composite particle, containing a silica-based composite particle that has a core particle mainly composed of amorphous silica (the "core particle" may also be referred to as "silica particle", hereinafter), and bound thereto a ceria particle mainly composed of crystalline ceria, the ceria particle further having on the surface thereof a silica film, the silica-based composite particle having an average particle size of 50 to 350 nm, and having features [1] to [3] below:

[1] the silica-based composite particle has a mass ratio of silica and ceria of 100:11 to 316;
[2] the silica-based composite particle when measured by X-ray diffractometry allows detection of a crystal phase of ceria only; and
[3] the silica-based composite particle when measured by X-ray diffractometry is found to have a crystallite size on the (111) plane (at around $2\theta=28°$) of crystalline ceria of 10 to 25 nm.

Such dispersion liquid of a silica-based composite particle may also be referred to as "the dispersion liquid of this invention", hereinafter.

The silica-based composite particle contained in the dispersion liquid of this invention may also be referred to as "the composite particle of this invention", hereinafter.

This invention also relates to a method of manufacturing a dispersion liquid of a silica-based composite particle, by which the dispersion liquid of this invention may be obtained. The method includes Step 1 to Step 3 below:

Step 1: keeping a silica particle dispersion liquid, having a silica particle dispersed in a solvent, stirred at a temperature of 5 to 98° C., and at a pH of 7.0 to 9.0, and adding thereto a metal cerium salt in a continuous or intermittent manner, to thereby obtain a precursor particle dispersion liquid containing a precursor particle;

Step 2: drying the precursor particle dispersion liquid, followed by calcination at 400 to 1,200° C., subjecting the obtained calcined product to treatment (i) or (ii) below, to thereby obtain a dispersion liquid of the disintegrated calcined product:
(i) dry disintegration/grinding, followed by addition of a solvent for solvent dispersion; or
(ii) wet disintegration/grinding under addition of a solvent, conducted at pH8.6 to 10.8,
and, Step 3: centrifuging the dispersion liquid of the disintegrated calcined product at a relative centrifugal acceleration of 300 G or larger, and removing a precipitated component, to thereby obtain a dispersion liquid of a silica-based composite particle.

Such method of manufacturing the dispersion liquid of a silica-based composite particle may also be referred to as "the manufacturing method of this invention", hereinafter.

The dispersion liquid of this invention is preferably manufactured by the manufacturing method of this invention.

In the description below, a simple notation of "this invention" should be understood to cover all of the dispersion liquid of this invention, the composite particle of this invention, and manufacturing method of this invention.

The composite particle of this invention will be explained.
<Core Particle>

In the composite particle of this invention, the core particle uses amorphous silica as a major component.

The fact that silica contained in the core particle in this invention is amorphous may be confirmed typically by the method below. The dispersion liquid (silica particle dispersion liquid) containing the core particle (silica particle) is dried, ground in a mortar, measured using a known X-ray diffractometer (for example, RINT1400, from Rigaku Corporation), to obtain an X-ray diffraction pattern, showing no peak assignable to crystalline silica such as cristobalite. Based on this fact, silica contained in the core particle (silica particle) may be confirmed to be amorphous.

Now, the "major component" means that the content rate of which is 90% by mass or above. That is, in the core particle, the content rate of amorphous silica is 90% by mass or above. The content rate is preferably 95% by mass or above, more preferably 98% by mass or above, and even more preferably 99.5% by mass or above.

In the description of this invention below, the term "major component" will always be used in this sense.

The core particle contains amorphous silica as the major component, and may contain other components, such as crystalline silica, impurity elements and so forth.

For example, in the core particle (silica particle), the content rate of each element selected from Na, Ag, Al, Ca, Cr, Cu, Fe, K, Mg, Ni, Ti, Zn and Zr (may collectively be referred to as "specific impurity group 1", hereinafter) is preferably 100 ppm or below. It is more preferably 50 ppm or below, even more preferably 25 ppm or below, yet more preferably 5 ppm or below, and furthermore preferably 1 ppm or below. In addition, the content rate of each element selected from U, Th, Cl, $NO_3$, $SO_4$ and F (may collectively be referred to as "specific impurity group 2", hereinafter), in the core particle (silica particle), is preferably 5 ppm or below.

A silica particle prepared from water glass usually contains the specific impurity group 1 and the specific impurity group 2 derived from the raw material, whose content is several thousand ppm in total.

This sort of silica particle dispersion liquid having such silica particle dispersed in a solvent, even it might have been ion-exchanged to have reduced content rates of specific impurity group 1 and specific impurity group 2, will have several ppm to several hundred ppm in total of the specific impurity group 1 and the specific impurity group 2 remaining therein. For this reason, the silica particle derived from water glass, when used, is occasionally subjected to acid treatment so as to reduce the impurity content.

Meanwhile, in the silica particle dispersion liquid, having dispersed in a solvent the silica particle derived from alkoxysilane, the content of each element and each anion in the specific impurity group 1 and the specific impurity group 2 is usually 20 ppm or below.

In this invention, the content rate of each of Na, Ag, Al, Ca, Cr, Cu, Fe, K, Mg, Ni, Ti, Zn, Zr, U, Th, Cl, $NO_3$, $SO_4$ and F, in the core particle (silica particle), is determined by measurement based on the methods below:

Na and K: atomic absorption spectrometry

Ag, Al, Ca, Cr, Cu, Fe, Mg, Ni, Ti, Zn, Zr, U and Th: ICP (inductively-coupled plasma) atomic emission spectrometry Cl: potentiometric titration $NO_3$, $SO_4$ and F: ion chromatography As will be described later, since the silica-based composite particle of this invention has an average particle size in the range from 50 to 350 nm, so that the average particle size of its core particle falls below 350 nm as a matter of course. In this patent specification, the average particle size of core particle is considered to be same as the average particle size of the silica particle contained in the silica particle dispersion liquid, which is used in Step 1 of the later-described manufacturing method of this invention. The silica-based composite particle, whose core particle having an average particle size of 30 to 200 nm, is preferably used.

With the core particle whose average particle size is controlled within the above described range, the dispersion liquid of this invention will produce less scratches when it is used as an abrasive. Too small average particle size of the core particle will, however, result in shortage of polishing rate. Also too large average particle size will lower the polishing rate, and will tend to degrade the surface accuracy of substrate.

The average particle size of core particle (silica particle) in this invention means values measured by dynamic light scattering method or laser diffraction/scattering method. More specifically, it means values obtained by measurement based on the method below. The silica particle is dispersed in water or the like to obtain a silica particle dispersion liquid, and the silica particle dispersion liquid is subjected to measurement using a known particle size analyzer based on the dynamic light scattering method (for example, Microtrac UPA from Nikkiso Co., Ltd., or PAR-III from Otsuka Electronics Co., Ltd.), or using a measuring instrument based on the laser diffraction/scattering method (for example, LA-950 from HORIBA Ltd.).

The measuring instrument is selectively used depending on purposes of the individual steps and predicted particle sizes and particle size distribution. More specifically, monodisperse raw silica particle with a uniform particle size of approximately 100 nm or smaller is measured with PAR-III, monodisperse raw silica particle with a large particle size of 100 nm or larger is measured using LA-950, meanwhile Microtrac UPA or LA-950 is preferably used in the disintegration step where the particle size widely varies from micrometers to nanometers as a result of disintegration.

Shape of the core particle (silica particle) is not specifically limited, and may have shapes of sphere, barrel, short fiber, tetrahedron (triangular pyramid), hexahedron, octahedron, plate, irregular form, or may be a shape having warts on the surface, confetti, and even may be porous, wherein spherical shape is preferable. Now the core particle is defined to be "spherical" if the ratio of the number of lone core particles having a short diameter/long diameter value of 0.8 or smaller is 10% or less. The core particle preferably has a ratio of the number of particles, having a short diameter/long diameter value of 0.8 or smaller, of 5% or less, and more preferably 0%.

The short diameter/long diameter value is measured by a method same as the later-described method (image analysis) of measuring short diameter/long diameter value of the composite particle of this invention.

<Ceria Particle>

The composite particle of this invention has a ceria particle on the surface of the above-described core particle. The ceria particle is preferably bound to the surface of the core particle. Alternatively, the ceria particle entirely covered with a silica film may be bound to the core particle while placing the silica film in between. Also this mode of embodiment is understood to represent presence of the ceria particle on the surface of the core particle, and is encompassed in the technical scope of this invention.

In the composite particle of this invention, the ceria particle is mainly composed of crystalline ceria.

The fact that the ceria particle is composed of crystalline ceria may be confirmed based on a finding that, for example, the dispersion liquid of this invention, after dried, ground in a mortar, and measured using a known X-ray diffractometer (for example, RINT1400, from Rigaku Corporation) shows only a crystal phase of ceria in an X-ray diffraction pattern. The crystal phase of ceria is exemplified by cerianite.

The ceria particle, mainly composed of crystalline ceria (crystalline Ce oxide), may contain other component, such as element(s) other than cerium.

Note, however, that the composite particle of this invention, when subjected to X-ray diffractometry as described above, allows detection of crystal phase of ceria only. In other words, any crystal phase of component other than ceria, even if should be contained, will fall outside the detectable range of X-ray diffractometry, since the content thereof is small.

Definition of the "major component" has been described above.

In relation to the ceria particle, crystalline ceria has a crystallite size on the (111) plane (at around $2\theta=28°$), measured by subjecting the composite particle of this invention to X-ray diffractometry, of 10 to 25 nm, more preferably 11 to 20 nm, and even more preferably 12 to 18 nm.

The crystallite size of crystalline ceria on the (111) plane (at around 2θ=28°) is a value obtained by the method described below.

First, the composite particle of this invention is ground in a mortar, and measured using a known X-ray diffractometer (for example, RINT1400, from Rigaku Corporation), to obtain an X-ray diffraction pattern. On the thus obtained X-ray diffraction pattern, the full-width at half maximum of a peak assignable to the (111) plane, appeared at around 2θ=28°, is measured, and the crystallite size is determined from the Scherrer's equation below:

$$D=K\lambda/\beta \cos \theta$$

D: crystallite size (Å)
K: Scherrer constant
Λ: X-ray wavelength (1.7889 Å, Cu lamp)
B: full-width at half maximum (rad)
θ: angle of reflection The ceria particle is preferably smaller than the core particle, preferably with an average particle size of 11 to 26 nm, and more preferably 12 to 23 nm. The size of ceria particle means a value determined by measuring the size of fifty arbitrarily selected ceria particles on a projection photography taken under a transmission electron microscope at a 300,000× magnification (for example, FIG. 1(C) described later), and by finding a simple average of these measured values.

<Silica Film>

The composite particle of this invention has the ceria particle on the surface of the core particle, and the ceria particle further has on the surface thereof a silica film. It is now preferable that the ceria particle is bound to the surface of the core particle, and that the silica film is provided so as to cover them. In other words, the silica film preferably covers a part of, or the entire portion of, the composite particle having the ceria particle bound to the surface of the core particle. As a consequence, the silica film resides on the topmost surface of the composite particle of this invention.

In an image (TEM image) of the composite particle of this invention observed under the transmission electron microscope, the ceria particle looks dark on the surface of the core particle, and on the exterior of the ceria particle, or, on the surface of the composite particle of this invention, the silica film appears relatively pale. The ceria particle is preferably bound to the core particle (silica particle), wherein the ceria particle partially or entirely covered with the silica film may be bound to the core particle while placing the silica film in between.

In an element distribution profile obtained by EDS analysis of the composite particle of this invention, a Ce-rich portion can be seen on the surface side of the particle, and a Si-rich portion can be seen further on the outside.

By the EDS measurement that irradiates electron beam selectively to the portion of silica film having been determined under the transmission electron microscope as described above, and by finding Si atomic percentage and Ce atomic percentage of this portion, it is now possible to confirm that the Si atomic percentage is very high. More specifically, ratio of Si atomic percentage relative to Ce atomic percentage (Si atomic percentage/Ce atomic percentage) will be 0.9 or larger.

This sort of silica film is considered to enhance bonding (force) between the ceria particle (ceria crystal grain) and the core particle (silica particle). Hence in the process of obtaining the dispersion liquid of this invention, the dispersion liquid of a silica-based composite particle can be obtained typically by subjecting the calcined silica-based composite particle to wet disintegration/grinding, wherein the silica film is considered to prevent the ceria particle (ceria crystal grain) from dropping off from the core particle (silica particle). In this case, local dropping of the ceria particle is permissible, and it is not always necessary for the ceria particle to be covered with the silica film over the entire surface. It suffices that the ceria particle has a level of tightness just enough to keep itself staying on the core particle during the disintegration/grinding step.

With such configuration, the dispersion liquid of this invention, when used as an abrasive, is considered to achieve a high polishing rate, and is less likely to degrade the surface accuracy or to increase scratches. Since the particle has less —OH groups as a result of crystallization, and can only weakly interact with —OH on the surface of the substrate to be polished, so that the particle is considered to adhere not so much on the surface of the substrate to be polished.

Ceria has a potential different from those of silica, substrate to be polished and polishing pad, whose negative zeta potential in the alkaline pH region reduces towards the neutral region, and turns to be positive in the weakly acidic region. Accordingly, ceria tends to adhere to the base to be polished or polishing pad, driven by differences in the potential and polarity, and tends to remain on the base to be polished and the polishing pad. In contrast, in the silica-based composite particle of this invention, since ceria which composes the ceria particle is at least partially covered with the silica film, so that it can keep a negative potential over the alkaline to acidic pH region, and is less likely to leave the abrasive grain on the base to be polished and polishing pad.

The thickness of silica film may be determined roughly based on the degree of coverage with the silica film, on the ceria-based ceria particle on the core particle, from TEM image or SEM image. More specifically, as has been described above, the ceria particle with a particle size of 20 nm or around can be seen dark, in the TEM image, on the surface of core particle, and further on the exterior of the ceria particle, the silica film can be seen relatively pale, so that the thickness of the silica film may roughly be determined by dimensional comparison with the ceria particle size. The thickness is estimated to be far smaller than 20 nm, if the ceria particle is clearly seen as an irregularity in the SEM image, and also if the silica-based composite particle is found to have an irregular contour on the TEM image. On the contrary, the thickness is estimated to be 20 nm or around, if the ceria particle is not clearly seen to be irregular in the SEM image, and also if the silica-based composite particle is not found to have an irregular contour in the TEM image.

Note that the outermost (opposite to the core particle) silica film does not always necessarily coat the entire portion of the ceria particle. In other words, there is the silica film on the topmost surface of the composite particle of this invention, but there may be some area without the silica film. Also there may be some area where the core particle of the silica-based composite particle exposes.

<Composite Particle of this Invention>

As has been described above, the composite particle of this invention has, on the surface of core particle, the ceria particle as described above.

In the composite particle of this invention, the mass ratio of silica and ceria is 100:11 to 316, preferably 100:30 to 230, more preferably 100:30 to 150, and even more preferably 100:60 to 120. The mass ratio of silica and ceria is considered to be almost equivalent to the mass ratio of the core particle and the ceria particle. If the amount of the ceria particle is too small relative to the core particle, the core particles may combine to produce a coarse particle. If this occurs, the abrasive (polishing slurry) containing the dispersion liquid of this invention may produce defects (degraded surface accuracy, such as increased scratches) on the surface of the base to be polished. On the contrary, too much ceria relative to silica will not only increase the cost, but will also increase a risk of resource depletion. Also the particles will continue to agglomerate. As a consequence, there will be a higher risk of causing troubles such as increased surface roughness of substrate (increased surface roughness Ra), increased scratches, residence of released ceria on the substrate, and adhesion to a waste liquid pipe of a polishing apparatus.

Now the silica whose mass ratio should be determined includes both of (I) and (II) below:

(I) silica component that composes the core particle; and (II) silica component contained in the silica film that covers the composite particle composed of a core particle and a ceria particle (ceria component) bound thereto.

The content rate (% by mass) of silica ($SiO_2$) and ceria ($CeO_2$) in the composite particle of this invention may be calculated as follows. First, the dispersion liquid of the composite particle of this invention (the dispersion liquid of this invention) is subjected to a loss-on-ignition procedure at 1000° C., to determine the solid content concentration by weighing.

Next, the content rate (% by mass) of cerium (Ce) contained in a predetermined amount of the composite particle of this invention is determined by ICP atomic emission spectrometry, and then converted to $CeO_2$% by mass. $SiO_2$% by mass may be determined, assuming that the component composing the composite particle of this invention, other than $CeO_2$, is solely $SiO_2$.

In the manufacturing method of this invention, mass ratios of silica and ceria may alternatively be determined, based on the amounts of consumption of a silica source and a ceria source used for preparing the dispersion liquid of this invention. This is applicable to a process by which ceria and silica will not be solubilized and removed. In this case, the amounts of consumption of ceria and silica show good agreements with the analytical values.

The composite particle of this invention has an irregular surface profile, since a granular crystalline ceria (ceria particle) is bound typically by sintering to the surface of the silica particle (core particle).

That is, at least either (preferably both) of the core particle and the ceria particle is sintered and tightly bound at their contact points. It is however allowable that the ceria particle covered with the silica film is bound to the core particle, while placing the silica film in between.

Although the shape of composite particle of this invention is not specifically limited, it is preferably of a particle-combined type in practice. The particle-combined type means that two or more core particles are partially bound to each other. The core particles are considered to be tightly bound, as a result of fusion of at least either (preferably both) of them at their contact point, and preferably as a result of cohesion of both of them. Now the particle-combined type is considered to encompass the cases where the core particles are mutually bound and the ceria particle is further bound thereto; and where the core particle having ceria particle bound on the surface thereof is bound to something else.

With the particle-combined type structure, the contact area with the substrate may be increased, and thereby polishing energy will be transmitted to the substrate in a highly efficient manner. This will give a high polishing rate. Concurrently, polishing pressure per particle will be reduced as compared with the pressure given by a lone particle, and thereby the scratches will be reduced.

In the composite particle of this invention, the ratio of the number of particles having a short diameter/long diameter value, determined by image analysis, of 0.80 or smaller (preferably 0.67 or smaller), is preferably 50% or more.

Now the particles having a short diameter/long diameter value, determined by image analysis, of 0.80 or smaller is considered to be of particle-combined type in principle.

A method of determining the short diameter/long diameter value based on image analysis will be explained. On a projection photography of the composite particle of this invention, taken under a transmission electron microscope at a 250,000× (to 500,000×) magnification, the maximum diameter of the particle is assumed to align on the long axis, and the length is measured to determine the long diameter (DL). The middle point of the long axis is determined on the long axis, a line that crosses at that point at right angles to the long axis is drawn, to find two points where the line meets the contour of the particle, and the distance between these two points is measured to determine the short diameter (DS). Using the values, the short diameter/long diameter value (DS/DL) is determined. Fifty arbitrarily selected particles are observed on the projection photography, and the ratio (%) of the number of particles having a short diameter/long diameter value of 0.80 or smaller is determined.

In the composite particle of this invention, the ratio (%) of the number of particles having a short diameter/long diameter value of 0.80 or smaller (preferably 0.67 or smaller) is preferably 55% or larger, and more preferably 65% or larger. The composite particle of this invention within these ranges can advantageously achieve a high polishing rate, when used as an abrasive.

The composite particle of this invention, which is more preferably of the particle-combined type as described above, may alternatively contain particles with some other shapes, such as spherical particles.

The composite particle of this invention preferably has a specific surface area of 4 to 100 m$^2$/g, and more preferably 30 to 60 m$^2$/g.

A method of measuring the specific surface area (BET specific surface area) will be explained.

First, a dried sample (0.2 g) is placed in a measuring cell, allowed to degas under a nitrogen gas flow at 250° C. for 40 minutes, then kept under flow of a mixed gas of 30% by volume of nitrogen and 70% by volume of helium at the liquid nitrogen temperature, so as to allow the sample to adsorb nitrogen under an equilibrium condition. Next, the temperature of the sample is gradually elevated to room temperature under a continuous flow of the mixed gas, the amount of released nitrogen during this process is detected, and the specific surface ratio of sample is determined, referring to a preliminarily prepared analytical curve.

This way of measurement of BET specific surface area (nitrogen absorption method) may be conducted typically by using a known surface area measuring instrument.

The specific surface area in this invention should be understood as the value obtained by the measurement described above, unless otherwise not specifically noted.

The composite particle of this invention preferably has an average particle size of 50 to 350 nm, and more preferably 170 to 260 nm. The composite particle of this invention, whose average particle size is controlled within the range from 50 to 350 nm, can advantageously increase the polishing rate when used as an adhesive.

The average particle size of the composite particle of this invention means the value measured by the dynamic light scattering method or laser diffracting/scattering method. More specifically, this means the value obtained by the measuring method below. The composite particle of this invention is dispersed into water, and the resultant composite particle dispersion liquid is subjected to measurement using a known particle size analyzer based on the dynamic light scattering method (for example, Microtrac UPA from Nikkiso Co., Ltd., or PAR-III from Otsuka Electronics Co., Ltd.), or using a measuring instrument based on the laser diffraction/scattering method (for example, LA-950 from HORIBA Ltd.).

In the composite particle of this invention, the content rate of each element in the specific impurity group 1 is preferably 100 ppm or below, more preferably 50 ppm or below, even more preferably 25 ppm or below, yet more preferably 5 ppm or below, and furthermore preferably 1 ppm or below. Meanwhile, in the composite particle of this invention, the content rate of each element in the specific impurity group 2 is preferably 5 ppm or below. For the methods of reducing the individual content rates of the elements in the specific impurity group 1 and the specific impurity group 2, in the composite particle of this invention, the methods having been described in relation to the core particle (silica particle) are adoptable.

The individual content rates of the elements in the specific impurity group 1 and the specific impurity group 2, in the composite particle of this invention, are defined by values obtained by measurement using an ICP (inductively coupled plasma) atomic emission spectrometer.

<Dispersion Liquid of this Invention>

The dispersion liquid of this invention will be explained. The dispersion liquid of this invention is an article having the above-mentioned composite particle of this invention dispersed in a dispersion solvent.

The dispersion liquid of this invention contains water and/or organic solvent, as the dispersion solvent. As the dispersion solvent, preferably used is water such as pure water, ultrapure water and deionized water. The dispersion liquid of this invention may also contain, as an additive, one or more items selected from the group consisting of polishing accelerator, surfactant, pH control agent and pH buffer.

As the dispersion solvent composing the dispersion liquid of this invention, usable are organic solvents which are exemplified by alcohols such as methanol, ethanol, isopropanol, n-butanol and methyl isocarbinol; ketones such as acetone, 2-butanone, ethyl amyl ketone, diacetone alcohol, isophorone and cyclohexanone; amides such as N,N-dimethylformamide and N,N-dimethylacetamide; ethers such as diethyl ether, isopropyl ether, tetrahydrofuran, 1,4-dioxane and 3,4-dihydro-2H-pyran; glycol ethers such as 2-methoxyethanol, 2-ethoxyethanol, 2-butoxyethanol, and ethylene glycol dimethyl ether; glycol ether acetates such as 2-methoxyethyl acetate, 2-ethoxyethyl acetate and 2-butoxyethyl acetate; esters such as methyl acetate, ethyl acetate, isobutyl acetate, amyl acetate, ethyl lactate and ethylene carbonate; aromatic hydrocarbons such as benzene, toluene and xylene; aliphatic hydrocarbons such as hexane, heptane, isooctane and cyclohexane; halogenated hydrocarbons such as methylene chloride, 1,2-dichloroethane, dichloropropane and chlorobenzene; sulfoxides such as dimethyl sulfoxide; and pyrrolidones such as N-methyl-2-pyrrolidone and N-octyl-2-pyrrolidone. They may be used after mixed with water.

The concentration of solid content contained in the dispersion liquid of this invention preferably falls in the range from 0.3 to 50% by mass.

The dispersion liquid of this invention is preferably designed to give a streaming potential curve when subjected to cation colloidal titration, from which ratio ($\Delta PCD/V$) of the amount of change of streaming potential ($\Delta PCD$), and the amount of consumption (V) of a cation colloidal titrant at a knick, given by Equation (1) below, is determined to be −110.0 to −15.0:

$$\Delta PCD/V=(I-C)/V \qquad \text{Equation (1)}$$

where,

C: streaming potential (mV) at knick; and

I: streaming potential (mV) at start point of streaming potential curve; and

V: amount of consumption (ml) of cation colloidal titrant at knick.

The cation colloidal titration is carried out by adding a cation colloidal titrant, to 80 g of the dispersion liquid of this invention adjusted to have a solid content concentration of 1% by mass. As the cation colloidal titrant, a 0.001 N poly(diallyldimethylammonium chloride) solution is used.

The streaming potential curve obtained from the cation colloidal titration is a graph with the amount of consumption (ml) of the cation titrant scaled on the X-axis, and the streaming potential (mV) of the dispersion liquid of this invention scaled on the Y-axis.

The knick is a point (inflection point) where the streaming potential abruptly changes on the streaming potential curve obtained from cation colloidal titration. More specifically, the inflection point is given as Point A on a streaming potential curve shown in FIG. 10, and is denoted as "knick". The streaming potential at Point A is denoted as C (mV), and the amount of consumption of the cation colloidal titrant at Point A is denoted as V (ml).

The start point of streaming potential curve falls on the streaming potential of the dispersion liquid of this invention before titration. More specifically, as given by Point B on the streaming potential curve shown in FIG. 10, the point where the amount of consumption of cation colloidal titrant stays at zero is denoted as the start point. The streaming potential at Point B is denoted as I (mV).

With the value of $\Delta PCD/V$ controlled within the range from −110.0 to −15.0, the dispersion liquid of this invention, when used as the abrasive, will improve the polishing rate of the abrasive. $\Delta PCD/V$ is considered to reflect the degree of coverage with the silica film over the surface of the composite particle of this invention, and/or, the degree of exposure of the ceria particle over the surface of the composite particle, or existence of easily-dropping silica. With the value of $\Delta PCD/V$ controlled within the above-described range, the present inventors contemplate that the ceria particle would be less likely to drop, even during wet disintegration/grinding, and would exhibit a high polishing rate. In contrast, when the absolute value of $\Delta PCD/V$ is larger than 110.0, meaning that the entire surface of the composite particle is covered with the silica film, the ceria particle will be less likely to drop, but this means that silica is hardly releasable during polishing, to thereby reduce the polishing rate. On the contrary, when the absolute value is smaller than 15.0, the dropping is considered to be more likely to occur. The present inventors contemplate that, within the above-described range, the surface of the ceria particle would expose to a suitable degree during polishing, the ceria particle would be less likely to drop, and thereby the polishing rate would be improved. ΔPCD/V is more preferably from −100.0 to −15.0, and even more preferably from −100.0 to −20.0.

The dispersion liquid of this invention preferably shows a negative streaming potential before being titrated, that is, when the amount of titrant is zero, with the pH adjusted to 3 to 8. This is because, if the streaming potential is kept at a negative value, the abrasive grain (silica-based composite particle) will less likely to remain on the base to be polished whose surface has again a negative potential.

Methods of manufacturing the dispersion liquid of this invention is preferably, but not limitatively, the manufacturing method of this invention described in the next.

<Manufacturing Method of this Invention>

The manufacturing method of this invention will be explained.

The manufacturing method of this invention includes Step 1 to Step 3 explained below.

<Manufacturing Method of this Invention>
<Step 1>

In Step 1, there is prepared a silica particle dispersion liquid having the silica particle dispersed in a solvent.

When the manufacturing method of this invention is intended to prepare a dispersion liquid of a silica-based composite particle applicable to polishing of semiconductor devices, it is preferable to use, as the silica particle dispersion liquid, a silica particle dispersion liquid whose silica particle has been obtained by hydrolyzing an alkoxysilane, and dispersed in a solvent. Note that, when a known silica particle dispersion liquid (for example, silica particle dispersion liquid originated from water glass) is used as a source, it is preferable to treat the silica particle dispersion liquid with an acid, and further to deionize it before use. This is because these processes can reduce the content rates of Na, Ag, Al, Ca, Cr, Cu, Fe, K, Mg, Ni, Ti, Zn, Zr, U, Th, Cl, $NO_3$, $SO_4$ and F in the silica particle, more specifically down to 100 ppm or below.

More specifically, the silica particle contained in the silica particle dispersion liquid, suitable as a source used for Step 1, preferably satisfy the conditions (a) and (b) below:

(a) the content rate of each of Na, Ag, Al, Ca, Cr, Cu, Fe, K, Mg, Ni, Ti, Zn and Zr is 100 ppm or below; and
(b) the content rate of each of U, Th, Cl, $NO_3$, $SO_4$ and F is 5 ppm or below.

In Step 1, the silica particle dispersion liquid, having such silica particle dispersed in a solvent, is kept stirred at the temperature range from 5 to 98° C., and in the pH range from 7.0 to 9.0, a cerium metal salt is added thereto in a continuous or intermittent manner, to thereby obtain a precursor particle dispersion liquid that contains a precursor particle.

The dispersion medium of the silica particle dispersion liquid preferably contains water. Aqueous silica particle dispersion liquid (hydrosol) is preferably used.

The solid content concentration of the silica particle dispersion liquid is preferably 1 to 40% by mass on the $SiO_2$ basis. Too low solid content concentration reduces the silica concentration in the manufacturing step, and would degrade the productivity.

Alternatively, if necessary, the silica particle dispersion liquid may be deionized, typically by extracting impurities using cation exchange resin, anion exchange resin, mineral acid, organic acid or the like, or by using ultrafiltration membrane. The silica particle dispersion liquid, having impurity ions or the like removed therefrom by deionization, is more preferable since it is likely to form a silicon-containing hydroxide on the surface thereof. Note that the deionization does not limitatively rely on the processes described above.

In Step 1, the above-described silica particle dispersion liquid is kept stirred at the temperature range from 5 to 98° C., and in the pH range from 7.0 to 9.0, and a cerium metal salt is added thereto in a continuous or intermittent manner.

Usable examples of the cerium metal salt include, but not limited to, chloride, nitrate, sulfate, acetate, carbonate and metal alkoxide of cerium. They are specifically exemplified by cerium(III) nitrate, cerium carbonate, cerium(III) sulfate and cerium(III) chloride. Among them, cerium(III) nitrate and cerium(III) chloride are preferable. Crystalline cerium oxide generates in a solution that became supersaturated upon being neutralized, and rapidly adheres to the silica particle based on an agglomeration/deposition mechanism. This is advantageous in view of efficiency of formation of bindable oxide. Sulfate ion, chloride ion, nitrate ion and so forth contained in these metal salts are however corrosive, so that the blending is necessarily followed by cleaning in the post-process to thereby reduce these ions down to 5 ppm or below. Meanwhile, the carbonate releases carbon dioxide gas, and the alkoxide decomposes to produce alcohol during blending, which are convenient.

The amount of consumption of ceria metal salt relative to the silica particle dispersion liquid is determined so that the mass ratio of silica and ceria, in the obtainable composite particle of this invention, will fall within the range from 100:11 to 316 as described previously.

After adding the cerium metal salt to the silica particle dispersion liquid, the mixture is preferably stirred at a temperature of 5 to 98° C., and more preferably 10 to 95° C. If the temperature is too low, the solubility of silica will considerably decreases, and this possibly makes the crystallization of ceria uncontrollable, and allows a coarse crystalline ceria oxide to generate, which can deposit on the silica particle (core particle) only with difficulty.

Conversely, if the temperature is too high, the solubility of silica will considerably increase, and this possibly suppress the crystalline ceria oxide from generating. This is not preferable also because a reactor wall will have an increased amount of scale.

The stirring preferably takes 0.5 to 24 hours, and more preferably 0.5 to 18 hours. Too short time is not beneficial since the crystalline cerium oxide will not sufficiently be formed. Conversely too long time is again not beneficial in view of economy, since the formation of crystalline cerium oxide can no longer proceed. After addition of the cerium metal salt, the mixture may optionally be ripened at 5 to 98° C. The ripening can accelerate the reaction by which the cerium compound deposits on the core particle.

The silica particle dispersion liquid, when stirred after addition of the cerium metal salt, is preferably adjusted to a pH range of 7.0 to 9.0, and preferably 7.6 to 8.6. In this process, the pH is preferably adjusted by using an alkali. Such alkali may be any known one. Specific examples include, but not limited to, aqueous ammonia solution, and aqueous solutions of alkali hydroxide, alkali earth metals and amines.

According to such Step 1, the dispersion liquid (precursor particle dispersion liquid) containing the particle (precursor particle), which is a precursor of the composite particle of this invention, is obtained.

Before being subjected to Step 2, the precursor particle dispersion liquid obtained in Step 1 may further be diluted with pure water or deionized water, or may be condensed.

The precursor particle dispersion liquid preferably has a solid content concentration of 1 to 27% by mass.

The precursor particle dispersion liquid may optionally be deionized by using cation exchange resin, anion exchange resin, ultrafiltration membrane, ion exchange membrane, or by centrifugation.

<Step 2>

In Step 2, the precursor particle dispersion liquid is dried, and then calcined at 400 to 1,200° C.

Methods of drying are not specifically limited. Any known drying apparatus may be used. More specifically, compartment dryer, band dryer or spray dryer may be used.

For still better practice, it is recommendable to adjust the precursor particle dispersion liquid before being dried to pH6.0 to 7.0. This is because the precursor particle dispersion liquid, if adjusted to pH6.0 to 7.0 before being dried, can suppress its surface activity.

After the drying, the calcination is allowed to proceed preferably at 400 to 1200° C., more preferably at 800 to 1100° C., and even more preferably 1000 to 1090° C. When calcined within these temperature ranges, ceria will crystallize to a sufficient degree, the silica film that resides on the surface of the ceria fine particle will be thickened to a suitable degree, and the core particle and the ceria particle will be tightly bound. If the temperature is too high, the ceria crystal would abnormally grow, or the silica film would grow thick to enhance binding with the core particle, but would cover the ceria particle too thickly, possibly resulting in crystallization of amorphous silica that composes the core particle, or excessive fusion of particles.

In Step 2, the calcined product obtained by the calcination is then subjected to treatment (i) or (ii) below, to thereby obtain a dispersion liquid of the disintegrated calcined product:

(i) dry disintegration/grinding, followed by addition of a solvent for solvent dispersion; or (ii) wet disintegration/grinding under addition of a solvent, conducted at pH8.6 to 10.8.

Dry disintegration/grinding apparatus applicable here may be known ones, which are exemplified by attritor, ball mill, vibrating mill, and vibrating ball mill.

Also wet disintegration/grinding applicable here may be known ones, which are exemplified by batch-type bead mills such as basket mill, lateral/vertical/annular-type continuous bead mills, sand grinder mill, ball mill, rotor-stator homogenizer, ultrasonic dispersion homogenizer, and wet medium agitation mills (wet disintegrator) such as impact grinding machine that allows the fine particles in the dispersion liquid to collide on each other. The beads used for the wet medium agitation mill are exemplified by those made of glass, alumina, zirconia, steel, and flint rock. In either treatment (i) or (ii), water and/or organic solvent are used as a solvent. For example, water such as ultrapure water or deionized water is preferably used. The dispersion liquid of the disintegrated calcined product obtained by treatment (i) or (ii) preferably, but not limitatively, has the solid content concentration typically within the range from 0.3 to 50% by mass. Among treatments (i) and (ii), wet treatment based on (ii) is more favored in practice.

In the wet disintegration/grinding based on (ii), the wet disintegration/grinding is preferably allowed to proceed, keeping the solvent at pH8.6 to 10.8. Within such pH range, it will be more easy to finally obtain the dispersion liquid of a silica-based composite particle that is designed to give a streaming potential curve when subjected to cation colloidal titration, from which ratio ($\Delta$PCD/V) of the amount of change of streaming potential ($\Delta$PCD), and the amount of consumption (V) of a cation colloidal titrant at a knick, given by Equation (1), is determined to be −110.0 to −15.0.

In other words, it is preferable to carry out the disintegration/grinding, enough to a degree that suffices to obtain the dispersion liquid of this invention corresponded to the aforementioned preferred embodiment. This is because the polishing rate may further be improved, by using as the abrasive the dispersion liquid of this invention corresponded to the aforementioned preferred embodiment. Regarding this, the present inventors contemplate that, as a result of moderate thinning of the silica film on the surface of the composite particle of this invention, and/or moderate exposure of the ceria particle on a part of the surface of the composite particle, now the polishing rate is further improved, and the ceria particle may be prevented from dropping. The inventors also consider that, since the silica film is thin or worn, so that the ceria particle would be releasable to a certain degree. $\Delta$PCD/V is more preferably −100.0 to −15.0, and even more preferably −100.0 to −20.0.

<Step 3>

In Step 3, the dispersion liquid of the disintegrated calcined product obtained in Step 2 is centrifuged at a relative centrifugal acceleration of 300 G or above, then the precipitated component is removed, to obtain a dispersion liquid of a silica-based composite particle.

More specifically, the dispersion liquid of the disintegrated calcined product is classified by centrifugation. The relative centrifugal acceleration in the centrifugation process is set to 300 G or above. After the centrifugation, the precipitated component is removed, and thus the dispersion liquid of a silica-based composite particle may be obtained. The upper limit of the relative centrifugal acceleration is practically, but not limitatively, set to 10,000 G or below.

Step 3 necessarily includes the centrifugation process that satisfies the conditions above. If the centrifugal acceleration or the centrifugation time does not satisfy the conditions above, the dispersion liquid of a silica-based composite particle will have coarse particles remained therein, possibly causing scratches when used as the adhesive for polishing.

In this invention, the dispersion liquid of a silica-based composite particle, obtained by the aforementioned manufacturing method, may further be dried to obtain a silica-based composite particle. Methods of drying are not specifically limited, and any known drying apparatus may be used.

According to such manufacturing method of this invention, obtainable is the dispersion liquid of this invention.

After addition of cerium to the silica particle dispersion liquid, the blended liquid preferably shows a positive redox potential. This is because, if the redox potential should turn negative, the cerium compound would not deposit on the surface of the silica particle but would instead produce plate- or rod-like single cerium particles. Methods of keeping the redox potential positive are exemplified by, but not limited to, a method of adding an oxidant such as hydrogen peroxide, and aeration.

<Polishing Slurry>

A liquid containing the dispersion liquid of this invention is suitably used as a polishing slurry (referred to as "the polishing slurry of this invention", hereinafter). In particular, it is suitably used as a polishing slurry used for planarizing semiconductor substrates having a $SiO_2$ insulating film formed thereon.

The polishing slurry of this invention can demonstrate excellent effects such that the polishing rate on semiconductor substrates is high, that the polishing causes less flaw (scratch) on the surface to be polished, and that the abrasive grain is less likely to remain on the substrates.

The polishing slurry of this invention contains water and/or organic solvent as the dispersion solvent. As the dispersion solvent, it is preferable to use water such as pure water, ultrapure water or deionized water. The polishing slurry of this invention may contain, as an additive, one or more items selected from the group consisting of polishing accelerator, surfactant, heterocyclic compound, pH control agent, and pH buffer.

<Polishing Accelerator>

For the polishing slurry of this invention, any known polishing accelerator may optionally be used, depending on types of the object to be polished. Specific examples thereof include hydrogen peroxide, peracetic acid, urea peroxide, and mixtures of them. The abrasive composition containing the polishing accelerator such as hydrogen peroxide, when used for metal objects to be polished, will effectively improve the polishing rate.

Other examples of the polishing accelerator include inorganic acids such as sulfuric acid, nitric acid, phosphoric acid, oxalic acid and hydrofluoric acid; organic acids such as acetic acid; sodium salts, potassium salts, ammonium salts and amine salts of these acids; and mixtures of these compounds. The polishing composition containing any of these polishing accelerators, when used for polishing objects to be polished that is composed of composite components, can accelerate the polishing rate of a specific component in the object to be polished, and can finally obtain a flat polished surface.

When the polishing slurry of this invention contains the polishing accelerator, the content thereof is preferably 0.1 to 10% by mass, and more preferably 0.5 to 5% by mass.

<Surfactant and/or Hydrophilic Compound>

Cationic, anionic, nonionic or amphoteric surfactant, or hydrophilic compound may be added in order to improve dispersibility and stability of the polishing slurry. Both of the surfactant and the hydrophilic compound have effects of reducing the angle of contact on the surface to be polished, and of promoting uniform polishing. The surfactant and/or hydrophilic compound, selected from the group below, may be used.

The anionic surfactant is exemplified by carboxylate, sulfonate, sulfuric acid ester salt and phosphoric acid ester salt, wherein the carboxylate is exemplified by soap, N-acylamino acid salt, polyoxyethylene or polyoxypropylene alkyl ether carboxylate, and acylated peptide; the sulfonate is exemplified by alkyl sulfonate, alkyl benzene and alkyl naphthalene sulfonates, naphthalene sulfonate, sulfosuccinate, α-olefin sulfonate, and N-acylsulfonate; the sulfuric acid ester salt is exemplified by sulfated oil, alkyl sulfate, alkyl ether sulfate, polyoxyethylene or polyoxypropylene alkyl allyl ether sulfate, and alkylamide sulfate; and the phosphoric acid ester salt is exemplified by alkyl phosphate, polyoxyethylene or polyoxypropylene alkyl allyl ether phosphate.

The cationic surfactant is exemplified by aliphatic amine salt, aliphatic quaternary ammonium salt, benzalkonium chloride, benzethonium chloride, pyridinium salt, and imidazolinium salt; and amphoteric surfactant is exemplified by those of carboxybetain-type, sulfobetain-type, aminocarboxylate, imidazolinium betain, lecithin, and alkylamine oxide.

The nonionic surfactant is exemplified by those of ether-type, ether ester-type, ester-type, and nitrogen containing-type. The ether-type ones are exemplified by polyoxyethylene alkyl and alkyl phenyl ethers, alkylallylformaldehyde-condensed polyoxyethylene ether, polyoxyethylene polyoxypropylene block polymer, and polyoxyethylene polyoxypropylene alkyl ether. The ether ester-type ones are exemplified by polyoxyethylene ether of glycerin ester, polyoxyethylene ether of sorbitan ester, and polyoxyethylene ether of sorbitol ester. The ester-type ones are exemplified by polyethylene glycol fatty acid ester, glycerin ester, polyglycerin ester, sorbitan ester, propylene glycol ester and sucrose ester. The nitrogen containing-type ones are exemplified by fatty acid alkanolamide, polyoxyethylene fatty acid amide and polyoxyethylene alkylamide. Still other examples include fluorine-containing surfactant.

The surfactant is preferably the anionic surfactant or the nonionic surfactant. The salt is exemplified by ammonium salt, potassium salt and sodium salt, wherein the ammonium salt and potassium salt are particularly preferable.

Still other surfactants and hydrophilic compound are exemplified by esters such as glycerin ester, sorbitan ester and alanine ethyl ester; ethers such as polyethylene glycol, polypropylene glycol, polytetramethylene glycol, polyethylene glycol alkyl ether, polyethylene glycol alkenyl ether, alkylpolyethylene glycol, alkyl polyethylene glycol alkyl ether, alkylpolyethylene glycol alkenyl ether, alkenylpolyethylene glycol, alkenylpolyethylene glycol alkyl ether, alkenylpolyethylene glycol alkenyl ether, polypropylene glycol alkyl ether, polypropylene glycol alkenyl ether, alkylpolypropylene glycol, alkylpolypropylene glycol alkyl ether, alkylpolypropylene glycol alkenyl ether and alkenylpolypropylene glycol; polysaccharides such as arginic acid, pectic acid, carboxymethyl cellulose, curdlan and pullulan; amino acid salts such as glycine ammonium salt and glycine sodium salt;

polycarboxylic acids and salts thereof such as polyaspartic acid, polyglutamic acid, polylysine, polymalic acid, polymethacrylic acid, ammonium polymethacrylate, sodium polymethacrylate, polyamic acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamic acid, ammonium polyamidate, sodium polyamidate and polyglyoxylic acid; vinyl-based polymers such as polyvinyl alcohol, polyvinylpyrrolidone and polyacrolein; sulfonic acids and salts thereof such as ammonium methyltaurinate, sodium methyltaurinate, sodium methylsulfate, ammonium ethylsulfate, ammonium butylsulfate, sodium vinylsulfonate, sodium 1-allylsulfonate, sodium 2-allylsulfonate, sodium methoxymethylsulfonate, ammonium ethoxymethylsulfonate and sodium 3-ethoxylpropylsulfonate; and amides such as propionamide, acrylamide, methylurea, nicotinamide, succinamide and sulfanilamide.

When the base to be polished is a glass substrate, any of these surfactants may suitably be used, meanwhile for silicon substrate for semiconductor integrated circuit, which is strictly banned from being affected by contamination with alkali metals, alkali earth metals or halides, it is preferable to use surfactant categorized in acids or ammonium salts thereof.

When the polishing slurry of this invention contains the surfactant and/or hydrophilic compound, the content thereof, in total, is preferably 0.001 to 10 g per one liter of polishing slurry, more preferably 0.01 to 5 g, and particularly 0.1 to 3 g.

The content of the surfactant and/or hydrophilic compound is preferably 0.001 g or more per one liter of polishing slurry, in view of obtaining a sufficient effect, meanwhile, preferably 10 g or less in view of preventing the polishing rate from decreasing.

Only a single species, or two or more species of the surfactants or hydrophilic compounds may be used, wherein items from different categories may be combined.

<Heterocyclic Compound>

When the base to be polished contains a metal, the polishing slurry of this invention may contain a heterocyclic compound, for the purpose of suppressing erosion of the base to be polished, in expectation of forming a passivation layer or a dissolution-suppressive layer on the metal. The "heterocyclic compound" means a compound having a heterocycle that contains one or more hetero atoms. The hetero atom is an atom other than carbon atom and hydrogen atom. The heterocycle is a cyclic compound having at least one hetero atom. The hetero atom means only an atom that forms a constitutive moiety of the ring system of the heterocycle, but does not means an atom that resides outside the ring system, an atom that resides separately from the ring system while placing in between at least one non-conjugative single bond, and an atom that forms a part of a substituent on the ring system. The hetero atom is preferably exemplified by, but not limited to, nitrogen atom, sulfur atom, oxygen atom, selenium atom, tellurium atom, phosphorus atom, silicon atom, and boron atom. As the heterocyclic compound, usable are imidazole, benzotriazole and tetrazole for example. They are more specifically exemplified by, but not limited to, 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, and 3,5-diamino-1,2,4-triazole.

The content of the heterocyclic compound, when blended into the polishing slurry of this invention, is preferably 0.001 to 1.0% by mass, more preferably 0.001 to 0.7% by mass, and even more preferably 0.002 to 0.4% by mass.

<pH Control Agent>

Typically for the purpose of enhancing the effects of the individual additive enumerated above, an acid or a base may optionally be added so as to control the pH of the polishing composition.

To control the polishing slurry to pH7 or above, an alkaline pH control agent is used. Preferably used are sodium hydroxide, aqueous ammonia, ammonium carbonate, and amines such as ethylamine, methylamine, triethylamine and tetramethylamine.

To control the polishing slurry to below pH7, an acidic pH control agent is used. Preferably used are acetic acid; hydroxy acids such as lactic acid, citric acid, malic acid, tartaric acid and glyceric acid; and mineral acids such as hydrochloric acid and nitric acid.

<pH Buffer>

To keep the pH value of the polishing slurry constant, a pH buffer may be used. As the pH buffer, phosphate and borate such as ammonium dihydrogen phosphate, ammonium hydrogen phosphate and ammonium tetraborate tetrahydrate; or organic acid may be used.

Examples of the dispersion solvent used for the polishing slurry of this invention include organic solvents which are exemplified by alcohols such as methanol, ethanol, isopropanol, n-butanol and methyl isocarbinol; ketones such as acetone, 2-butanone, ethyl amyl ketone, diacetone alcohol, isophorone and cyclohexanone; amides such as N,N-dimethylformamide and N,N-dimethylacetamide; ethers such as diethyl ether, isopropyl ether, tetrahydrofuran, 1,4-dioxane and 3,4-dihydro-2H-pyran; glycol ethers such as 2-methoxyethanol, 2-ethoxyethanol, 2-butoxy ethanol and ethylene glycol dimethyl ether; glycol ether acetates such as 2-methoxyethyl acetate, 2-ethoxyethyl acetate and 2-butoxy ethyl acetate; esters such as methyl acetate, ethyl acetate, isobutyl acetate, amyl acetate, ethyl lactate and ethylene carbonate; aromatic hydrocarbons such as benzene, toluene and xylene; aliphatic hydrocarbons such as hexane, heptane, isooctane and cyclohexane; halogenated hydrocarbons such as methylene chloride, 1,2-dichloroethane, dichloropropane and chlorobenzene; sulfoxides such as dimethyl sulfoxide; and pyrrolidones such as N-methyl-2-pyrrolidone and N-octyl-2-pyrrolidone. These solvents may be used after mixing with water.

The solid content concentration of the polishing slurry of this invention preferably falls in the range from 0.3 to 50% by mass. Too low solid content concentration would reduce the polishing rate. Conversely, too high solid content concentration would be uneconomical, since the polishing rate rarely improves.

EXAMPLES

This invention will be explained referring to Examples. This invention is, however, not limited to the Examples.

Experiment 1

First, the individual methods of measurement and test in Examples and Comparative Examples will be detailed. Results of measurements and tests in the individual Examples and Comparative Examples will be summarized in Table 1.

[Component Analyses]

[Silica Particle (Core Particle)]

For the silica particle derived from sodium silicate, the weight of $SiO_2$ in the silica particle dispersion liquid described later was determined by weighing based on loss-on-ignition at 1000° C. For the silica particle derived from alkoxysilane, the weight of $SiO_2$ was determined by weighing after the silica particle dispersion liquid was dried at 150° C. for one hour.

[Silica-Based Composite Particle]

The content rates of the individual elements are defined to be measured by the methods below.

First, 1 g of a sample (solid content=20% by mass) of the dispersion liquid composed of the silica-based composite particle is placed on a platinum dish. Three milliliters of phosphoric acid, 5 ml of nitric acid, and 10 ml of hydrofluoric acid are added, and the mixture is heated on a sand bath. After dried up, a small amount of water and 50 ml of nitiric acid are added for dissolution, the solution is placed in a 100-ml volumetric flask, and diluted with water to a total volume of 100 ml. With this solution, Na and K are measured using an atomic absorption spectrometer (Z-2310, from Hitachi Ltd., for example). Next, from the 100 ml of solution, a 10 ml aliquot is fractionated five times respectively into five 20-ml volumetric flasks, to thereby prepare five 10-ml fractions. Using these fractions, Al, Ag, Ca, Cr, Cu, Fe, Mg, Ni, Ti, Zn, Zr, U and Th are quantified using an ICP atomic emission spectrometry (SPS5520, from SII NanoTechnology, Inc., for example) based on the standard addition method. In this process, also the blank is measured in the same way, and the measured values of the individual elements are then corrected by subtracting therefrom the blank value.

The content rates (contents) of the Na, Al, Ag, Ca, Cr, Cu, Fe, K, Mg, Ni, Ti, Zn, Zr, U and Th components in this invention are defined to be the values obtained by the above-described measurement method, unless otherwise specifically noted.

The content rates of the individual anions are defined to be measured according to the methods below.

<Cl>

To 20 g (solid content=20% by mass) of a sample composed of the dispersion liquid of a silica-based composite particle, acetone is added to a total volume of 100 ml, and then 5 ml of acetic acid and 4 ml of a 0.001 mol sodium chloride solution are added thereto, and the mixture is analyzed by potentiometric titration (potentionmetric titrator AT-610, from Kyoto Electronics Manufacturing Co., Ltd.), with a 0.002 mol silver nitrate solution.

For a separate blank measurement, a mixture of 100 ml of acetone and 4 ml of a 0.001 mol sodium chloride solution is titrated with a 0.002 mol silver nitrate solution to preliminarily determine a titer, and the blank value is subtracted from the measurement value of the sample, to thereby determine the titer of sample.

<$NO_3$, $SO_4$, F>

Five grams of a sample (solid content=20% by mass) composed of the dispersion liquid of a silica-based composite particle is diluted with water to a total volume of 100 ml, the solution is then centrifuged in a centrifugal separator (HIMAC CT06E, from Hitachi, Ltd.) at 4000 rpm for 20 minutes, and the supernatant remained after removing the precipitated component is analyzed by ion chromatography (ICS-1100, from DIONEX Corporation).

<$SiO_2$, $CeO_2$>

When the content rates of silica and ceria of the silica-based composite particle are determined, first the dispersion liquid of a silica-based composite particle is subjected to a loss-on-ignition procedure at 1000° C., to determine the solid content concentration by weighing. Next, the content rate of Ce is measured using ICP atomic emission spectrometer (SPS5520, from SII NanoTechnology, Inc., for example) based on the standard addition method, in the same way as for Al to Th, and $CeO_2$% by mass is determined based on the thus found Ce content rate. $SiO_2$% by mass is then determined, assuming that the component composing the composite particle of this invention, other than $CeO_2$, is solely $SiO_2$.

The content rates of the individual elements or the individual anions in the silica particle (core particle) were determined by the above-described method for analyzing silica-based composite particle, except that the silica particle dispersion liquid was used as a sample, in place of the dispersion liquid of a silica-based composite particle.

[X-Ray Diffractometry, and Measurement of Crystallite Size]

According to the methods described above, each of the dispersion liquids of silica-based composite particle obtained in Examples and Comparative Examples was dried using a known drying apparatus, the obtained powder was ground in a mortar for 10 minutes, measured using an X-ray diffractometer (RINT1400, from Rigaku Corporation), and the crystal form was determined from the obtained X-ray diffraction pattern.

Also from the X-ray diffraction pattern obtained as described above, the full-width at half maximum of a peak assignable to the (111) plane (at around $2\theta=28°$) was measured, and the crystallite size was determined from the Scherrer's equation.

<Average Particle Size>

For each of the silica particle dispersion liquids and the dispersion liquids of silica-based composite particle obtained in Examples and Comparative Examples, the average particle size of the particle contained therein was measured by the aforementioned method. More specifically, the silica core particle was measured using PAR-III from Otsuka Electronics Co., Ltd. and LA950 from HORIBA, Ltd., and the silica-based composite particle was measured using Microtrac UPA from Nikkiso Co., Ltd.

<Short Diameter/Long Diameter Value>

Each particle, contained in the silica particle dispersion liquids and the dispersion liquids of silica-based composite particle obtained in Examples and Comparative Examples, was photographed under a transmission electron microscope (Model S-5500, from Hitachi, Ltd.) at a 250,000× (to 500,000×) magnification. On the thus-obtained projection photography, the maximum diameter of the particle was assumed to align on the long axis, and the length was measured to determine the long diameter (DL). The middle point of the long axis was determined on the long axis, a line that crosses at that point at right angles to the long axis is drawn, to find two points where the line meets the contour of the particle, and the distance between these two points was measured to determine the short diameter (DS). Using the values, the short diameter/long diameter value (DS/DL) was determined. Fifty arbitrarily selected particles were measured in this way, and the ratio (%) of the number of particles having a short diameter/long diameter value of 0.80 or smaller was determined.

[Method of Polishing Test]

<Polishing of $SiO_2$ Film>

Slurries (polishing slurries), containing the individual dispersion liquids of a silica-based composite particle obtained in Examples and Comparative Examples, were prepared. The solid content concentration was set to 0.6% by mass, and pH was adjusted to 5.0 by adding nitric acid.

Next, a substrate having $SiO_2$ insulating film (1 μm thick) formed thereon by thermal oxidation process was prepared.

Next, the substrate to be polished was set on a polishing apparatus (NF300, from Nano Factor Co., Ltd.) with a polishing pad ("IC-1000/SUBA400 Concentric Type", from Nitta Haas Inc.), and polished at a substrate load of 0.5 MPa, a table rotational speed of 90 rpm, while feeding a polishing slurry at a rate of 50 ml/min for one minute.

The polishing rate was calculated based on a change of weight of the base to be polished, between before and after polishing.

The surface smoothness (surface roughness Ra) of the base to be polished was measured using an atomic force microscope (AFM, from Hitachi High-Tech Science Corporation).

Scratch was checked by observing the surface of insulating film under an optical microscope.

<Polishing of Aluminum Hard Disk>

Slurries (polishing slurries), containing the individual dispersion liquids of a silica-based composite particle obtained in Examples and Comparative Examples, were prepared. The solid content concentration was set to 9% by mass, and pH was adjusted to 2.0 by adding nitric acid.

An aluminum hard disk substrate was set on the polishing apparatus (NF300, from Nano Factor Co., Ltd.) with a polishing pad ("Politex φ12", from Nitta Haas Inc.), and polished at a substrate load of 0.05 MPa, a table rotational speed of 30 rpm, while feeding a polishing slurry at a rate of 20 ml/min for five minutes. The entire surface was observed under an optical defect visualizer ("Micro-MAX", from Vision Psytec, Ltd.) at Zoom 15, the scratches (linear scars) that reside within a 65.97 $cm^2$ area of the polished surface of substrate were counted up, and evaluated according to the criteria below:

| Number of linear scars | Evaluation |
|---|---|
| <80 | "Few" |
| ≥80 | "Much" |
| * At least ≥80, too much to count | "X" |

Example 1

Preparation of <<Silica Particle Dispersion Liquid (Average Particle Size of Silica Particle: 60 nm)>>

There were mixed 12,090 g of ethanol and 6,363.9 g of ethyl orthosilicate, to prepare mixed liquid $a_1$.

Next, 6,120 g of ultrapure water and 444.9 g of a 29% aqueous ammonia were mixed, to prepare mixed liquid $b_1$.

Next, 192.9 g of ultrapure water and 444.9 g of ethanol were mixed to prepare heel water.

The heel water was conditioned at 75° C. under stirring, and thereto, mixed liquid $a_1$ and mixed liquid $b_1$ were added at the same time, so as to respectively complete the addition after the elapse of 10 hours. After completion of the addition, and the liquid was kept at 75° C. for 3 hours for ripening, the solid content concentration was adjusted, to obtain 9,646.3 g of silica particle dispersion liquid having the silica particle dispersed in the solvent, with a $SiO_2$ solid content concentration of 19% by mass, and an average particle size, measured by the dynamic light scattering method (PAR-III, from Otsuka Electronics Co., Ltd.), of 60 nm.

Preparation of <<Silica Particle Dispersion Liquid (Average Particle Size of Silica Particle: 108 nm)>>

There were mixed 2,733.3 g of methanol and 1,822.2 g of ethyl orthosilicate, to prepare mixed liquid $a_2$.

Next, 1,860.7 g of ultrapure water and 40.6 g of a 29% aqueous ammonia were mixed, to prepare mixed liquid $b_2$.

Next, 59 g of ultrapure water and 1,208.9 g of methanol were mixed to prepare heel water, and 922.1 g of the silica particle dispersion liquid, having the silica particle with an average particle size of 60 nm obtained in the previous step dispersed in a solvent, was added.

The heel water containing the silica particle dispersion liquid was kept stirred at 65° C., and thereto, the mixed liquid $a_2$ and the mixed liquid $b_2$ were added at the same time, so as to respectively complete the addition after the elapse of 18 hours. After completion of the addition, and the liquid was kept at 65° C. for 3 hours for ripening, the solid content concentration ($SiO_2$ solid content concentration) was adjusted to 19% by mass, to obtain 3,600 g of high-purity silica particle dispersion liquid.

The particle contained in the high-purity silica particle dispersion liquid was found to have an average particle size of 108 nm, when measured by the dynamic light scattering method (using PAR-III, from Otsuka Electronics Co., Ltd.). All of the content rates of Na, Ag, Al, Ca, Cr, Cu, Fe, K, Mg, Ni, Ti, Zn, Zr, U, Th, Cl, $NO_3$, $SO_4$ and F were found to be 1 ppm or below.

Next, to 1,053 g of the high-purity silica particle dispersion liquid, 114 g of a cation exchange resin (SK-1BH, from Mitsubishi Chemical Corporation) was gradually added, the mixture was stirred for 30 minutes, and the resin was removed. The pH at that time was found to be 5.1.

To the thus obtained silica particle dispersion liquid, ultrapure water was added, to obtain 6,000 g of Liquid A with a $SiO_2$ solid content concentration of 3% by mass.

Next, deionized water was added to cerium(III) nitrate hexahydrate (4N high-purity reagent, from Kanto Chemical Co., Inc.), to obtain Liquid B containing 2.5% by mass of $CeO_2$.

Next, Liquid A (6,000 g) was heated to 50° C., kept stirred, and thereto Liquid B (8,453 g, equivalent to 117.4 parts by mass of $CeO_2$ per 100 parts by mass of $SiO_2$) was added over 18 hours. Over the duration, the liquid temperature was kept at 50° C., and at pH7.85 by optionally using a 3% aqueous ammonia. The blended liquid during addition of Liquid B and ripening was kept aerated, so as to keep the redox potential positive.

After completion of addition of Liquid B, the mixture was heated to 93° C. and ripened for 4 hours. After ripened, the mixture was cooled down to room temperature by allowing it to stand in a room, and then washed through a ultrafiltration membrane under feeding with deionized water. The precursor particle dispersion liquid upon completion of washing was found to have a solid content concentration of 7% by mass, pH9.1 (at 25° C.), and an electric conductivity of 67 μs/cm (at 25° C.)

Next, to the thus obtained precursor particle dispersion liquid, a 5% by mass aqueous acetic acid solution was added, the pH was adjusted to 6.5, the mixture was allowed to dry in an drying oven at 100° C. for 16 hours, then calcined in a muffle furnace at 1090° C. for two hours, to obtain a powder.

Into a one-liter handled beaker, placed were 310 g of the powder obtained after calcination, and 430 g of deionized water, then a 3% aqueous ammonia solution was added, the mixture was kept stirred and sonicated in a ultrasonic bath for 10 minutes, to obtain a suspension of pH10 (at 25° C.) Next, into a grinding machine (LMZ06, from Ashizawa Finetech Ltd.), having preliminarily been cleaned and subjected to water operation, 595 g of 0.25 mm diameter quartz beads were placed, and the suspension was filled into a charge tank of the grinding machine (packing ratio=85%). Taking the deionized water remaining in a grinding chamber and a piping of the grinding machine into account, the concentration during grinding is estimated to be 25% by mass. Wet disintegration/grinding was carried out under the conditions including a peripheral speed of disk in the grinding machine of 12 m/sec, a number of passes of 25, and a residence time per pass of 0.43 minutes. In order to keep pH of the suspension at 10 during disintegration/grinding, a 3% aqueous ammonia solution was added for every pass. In this way, a dispersion liquid of a silica-based composite particle, having a solid content concentration of 22% by mass, was obtained.

Next, the thus obtained fine particle dispersion liquid was centrifuged (Model "CR21G", from Hitachi Koki Co., Ltd.,) at a relative centrifugal acceleration of 675 G for one minute, the precipitated component was removed, to obtain a dispersion liquid of a silica-based composite particle.

The silica-based composite particle contained in the thus obtained dispersion liquid of a silica-based composite particle, when analyzed by X-ray diffractometry, showed a diffraction pattern assignable to cerianite.

Next, the polishing test was carried out using the dispersion liquid of a silica-based composite particle. The short diameter/long diameter value of the silica-based composite particle, contained in the polishing slurry, was measured.

Table 1 shows average particle size of the silica particle (core particle) contained in the source silica particle dispersion liquid; ratio of the number of silica particles (core particles) having a short diameter/long diameter value of 0.8 or smaller; property and impurity content rate of the silica particle (core particle); silica content rate and ceria content rate (and ceria (parts by mass) per 100 parts by mass of silica) in the silica-based composite particle contained in the silica-based composite particle; calcination temperature during preparation of the silica-based composite particle; crystallite size of the silica-based composite particle; crystal form; content rate of impurity contained in the silica-based composite particle; average particle size of the silica-based composite particle; ratio of the number of particles having a short diameter/long diameter value of 0.8 or smaller in the silica-based composite particle; and polishing performances (polishing rate, surface roughness, observation results of scratch on the polished $SiO_2$ film; and scratch count on the polished aluminum hard disk). The same will apply also to Examples and Comparative Examples hereinafter.

The silica-based composite particle contained in the dispersion liquid of a silica-based composite particle obtained in Example 1 was observed under a SEM and TEM. A SEM image and a TEM image (100,000×) were shown in FIGS. 1(a) and (b), respectively.

A TEM image (300,000×) of the ceria particle taken for measuring the particle size was shown in FIG. 1(c).

Figure 2:
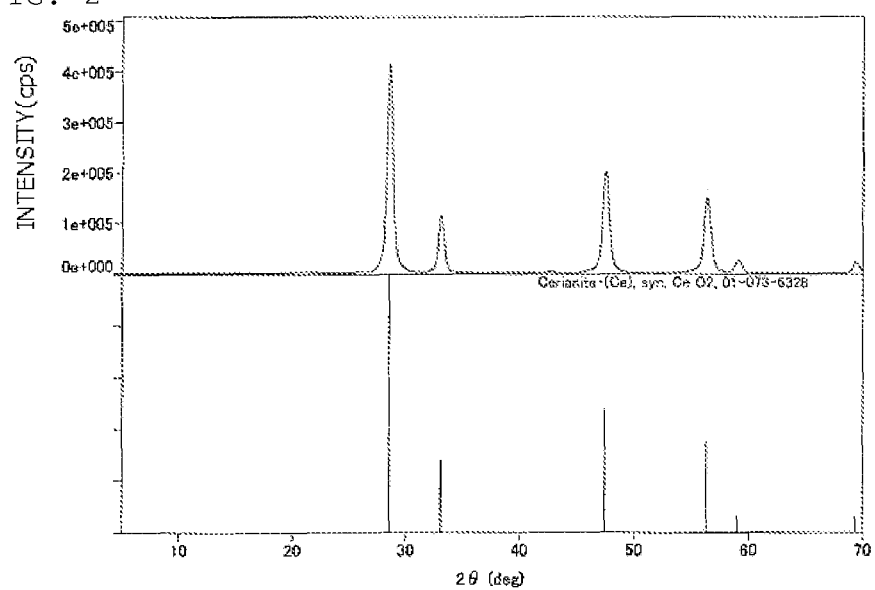
FIG. 2 An X-ray diffraction pattern obtained in Example 1.

FIG. 2 shows an X-ray diffraction pattern of the silica-based composite particle contained in the dispersion liquid of a silica-based composite particle obtained in Example 1.

The X-ray diffraction pattern of FIG. 2 very sharply indicated existence of cerianite crystal, and, judging from the TEM and SEM images, the ceria crystal grain was seemed to tightly sinter with the silica surface.

It was also observed from FIG. 1 that there was a thin silica film formed so as to cover the outermost surface of the silica-based composite particle.

Example 2

Example 2 was conducted in the same way as in Example 1, except that the amount of consumption of Liquid B was altered to 2,153 g (equivalent to 29.9 parts by mass of $CeO_2$ per 100 parts by mass of $SiO_2$). Also measurements and so forth were conducted in the same way.

Results are shown in Table 1.

Example 3

Example 3 was conducted in the same way as in Example 1, except that the amount of consumption of Liquid B was altered to 1,080 g (equivalent to 15 parts by mass of $CeO_2$ per 100 parts by mass of $SiO_2$). Also measurements and so forth were conducted in the same way.

Results are shown in Table 1.

Example 4

Preparation of <<Irregular-Shaped Silica Particle Dispersion Liquid (Average Particle Size of Silica Particle: 35 nm)>>

There were mixed 7,100 g of ethanol and 3,742 g of ethyl orthosilicate, to prepare mixed liquid $a_3$.

Next, 1,060 g of ultrapure water and 128 g of a 29% aqueous ammonia were mixed, to prepare mixed liquid $b_3$.

Next, 1,868 g of ethanol was reserved as a heel water.

The heel water was conditioned at 75° C. under stirring, and thereto, mixed liquid $a_3$ and mixed liquid $b_3$ were added at the same time, so as to respectively complete the addition after the elapse of 6 hours. After completion of the addition, and the liquid was kept at 75° C. for 3 hours for ripening, the $SiO_2$ solid content concentration was adjusted, to obtain 5,400 g of silica particle dispersion liquid having the silica particle, whose average particle size was measured to be 35 nm by the dynamic light scattering method (dynamic light scattering particle size analyzer PAR-III), dispersed in the solvent, with a $SiO_2$ solid content concentration of 19% by mass.

The obtained silica particle, when observed under an electron microscope, was found to have an irregular shape with a long diameter of 30 to 40 nm and a short diameter of 15 to 25 nm.

Ultrapure water was added to the thus obtained silica particle dispersion liquid, to prepare Liquid A with a $SiO_2$ solid content concentration of 3% by mass.

Next, the dispersion liquid of a silica-based composite particle containing the silica/ceria composite oxide was prepared under the same conditions as in Example 1, except that the amount of consumption of Liquid B was altered to 2,398 g (equivalent to 33.3 parts by mass of $CeO_2$ per 100 parts by mass of $SiO_2$). Operations and measurements were conducted in the same way as in Example 1. Results are shown in Table 1.

Example 5

Preparation of <<High-Purity Silicic Acid Solution>>

An aqueous sodium silicate solution with a $SiO_2$ concentration of 24.06% by mass and a $Na_2O$ concentration of 7.97% by mass was prepared. To the aqueous sodium silicate solution, pure water was added so as to adjust the $SiO_2$ concentration to 5.0% by mass.

[Acidic Silicic Acid Solution]

Eighteen kilograms of the thus obtained 5.0% by mass aqueous sodium silicate solution was allowed to pass through 6 L of strongly acidic cation exchange resin (SK1BH, from Mitsubishi Chemical Corporation) at a space velocity of 3.0 $h^{-1}$, to obtain 18 kg of acidic silicic acid solution of pH2.7.

The thus obtained acidic silicic acid solution was found to have a $SiO_2$ concentration of 4.7% by mass.

[High-Purity Silicic Acid Solution]

Next, the acidic silicic acid solution was allowed to pass through the strongly acidic cation exchange resin (SK1BH, from Mitsubishi Chemical Corporation) at a space velocity of 3.0 $h^{-1}$, to obtain a high-purity silicic acid solution of pH2.7. The thus obtained high-purity silicic acid solution was found to have a $SiO_2$ concentration of 4.4% by mass.

Preparation of <<Silica Particle Dispersion Liquid (Average Particle Size of Silica Particle: 25 nm)>>

To 42 g of pure water, 514.5 g of the high-purity silicic acid solution was added under stirring, 1,584.6 g of a 15% aqueous ammonia was added, then the mixture was heated to 83° C., and kept for 30 minutes.

Next, 13,700 g of the high-purity silicic acid solution was added over 18 hours. After completion of the addition, the mixture was kept at 83° C. for ripening, to obtain a dispersion liquid of a 25 nm silica particle.

The thus obtained silica particle dispersion liquid was cooled down to 40° C., and then condensed through the ultrafiltration membrane (SIP1013, from Asahi Kasei Corporation) up to a $SiO_2$ concentration of 12% by mass.

Preparation of <<Silica Particle Dispersion Liquid (Average Particle Size of Silica Particle: 45 nm)>>

To 991 g of pure water, 963 g of the 12% by mass dispersion liquid of a 25 nm silica particle was added under stirring. Then 1,414 g of a 15% aqueous ammonia was added, and the mixture was heated to 87° C., and kept for 30 minutes.

Next, 12,812 g of the high-purity silicic acid solution was added over 18 hours. After completion of the addition, the mixture was kept at 87° C. for ripening, to obtain a dispersion liquid of a 45 nm silica particle.

The thus obtained silica particle dispersion liquid was cooled down to 40° C., and then condensed through the ultrafiltration membrane (SIP1013, from Asahi Kasei Corporation) up to a $SiO_2$ concentration of 12% by mass.

Preparation of <<Silica Particle Dispersion Liquid (Average Particle Size of Silica Particle: 70 nm)>>

To 705 g of pure water, 705 g of the silica particle dispersion liquid, having the silica particle with an average particle size of 45 nm dispersed in the solvent ($SiO_2$ concentration=12% by mass), was added under stirring. Then 50 g of a 15% aqueous ammonia was added, and the mixture was heated to 87° C., and kept for 30 minutes.

Next, 7,168 g of the high-purity silicic acid solution was added over 18 hours. After completion of the addition, the mixture was kept at 87° C. for ripening, to obtain a silica particle dispersion liquid having the silica particle with an average particle size of 70 nm dispersed in the solvent.

The thus obtained silica particle dispersion liquid was cooled down to 40° C., and then condensed through the ultrafiltration membrane (SIP1013, from Asahi Kasei Corporation) up to a $SiO_2$ concentration of 12% by mass.

Preparation of <<Silica Particle Dispersion Liquid (Average Particle Size of Silica Particle: 96 nm)>>

To 1,081 g of pure water, 1,081 g of the dispersion liquid, having the silica particle with an average particle size of 70 nm dispersed in the solvent ($SiO_2$ concentration=12% by mass), was added under stirring. Then 50 g of a 15% aqueous ammonia was added, and the mixture was heated to 87° C., and kept for 30 minutes.

Next, 6,143 g of the high-purity silicic acid solution was added over 18 hours. After completion of the addition, the mixture was kept at 87° C. for ripening, to obtain a silica particle dispersion liquid having the silica particle, whose average particle size was measured to be 96 nm by dynamic light scattering method (dynamic light scattering particle size analyzer PAR-III), dispersed in the solvent.

The thus obtained silica particle dispersion liquid was cooled down to 40° C., and then condensed through the ultrafiltration membrane (SIP1013, from Asahi Kasei Corporation) up to a $SiO_2$ concentration of 12% by mass. To the condensed silica particle dispersion liquid, an anion exchange resin SANUP B, from Mitsubishi Chemical Corporation, was added to remove anion.

To the thus obtained silica particle dispersion liquid, ultrapure water was added to obtain Liquid A with a $SiO_2$ solid content concentration of 3% by mass.

The dispersion liquid of a silica-based composite particle containing the silica/ceria composite oxide was prepared under the same conditions as in Example 1, except that the amount of consumption of Liquid B was altered to 8,453 g (equivalent to 117.4 parts by mass of $CeO_2$, per 100 parts by mass of $SiO_2$). Operations and measurements were conducted in the same way as in Example 1. Results are shown in Table 1.

The dispersion liquid of a silica-based composite particle obtained in Example 5 was observed under a SEM and TEM. A SEM image and a TEM image (100,000×) were shown in FIGS. 3(a) and (b), respectively.

Figure 4:
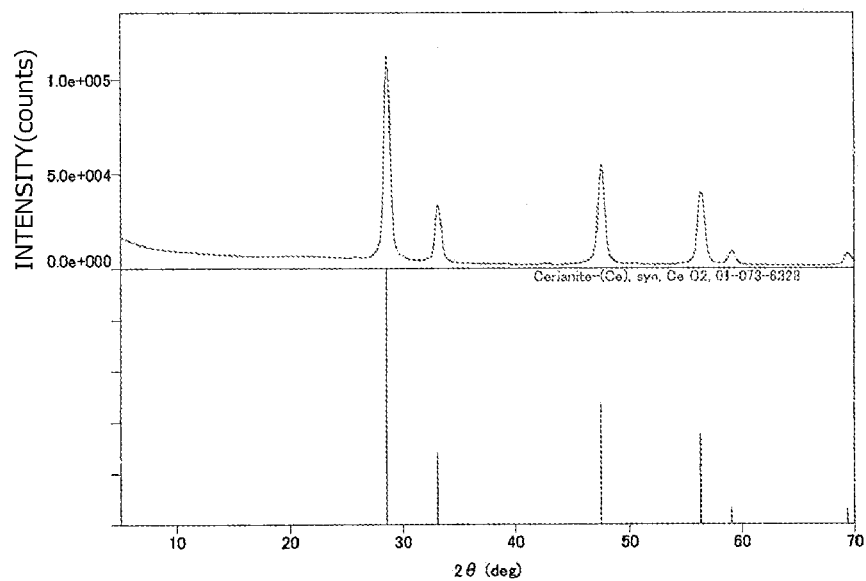
FIG. 4 An X-ray diffraction pattern obtained in Example 5.

FIG. 4 shows an X-ray diffraction pattern of the silica-based composite particle contained in the dispersion liquid of a silica-based composite particle obtained in Example 5.

Figure 3:
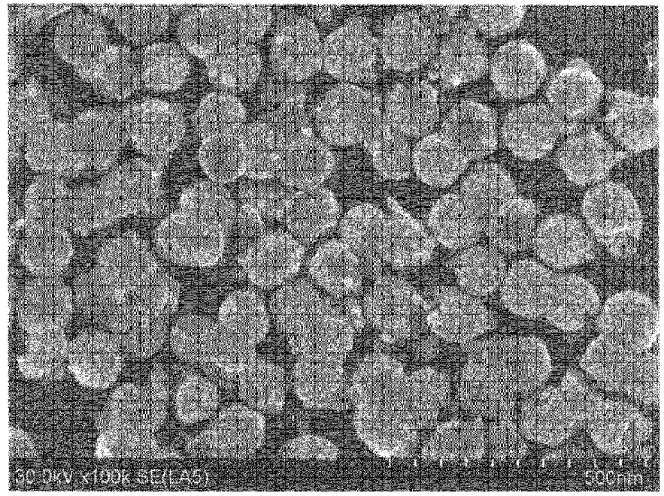
FIG. 3(a) is a SEM image obtained in Example 5.
FIG. 3(b) is a TEM image obtained in Example 5.
Figure 3:
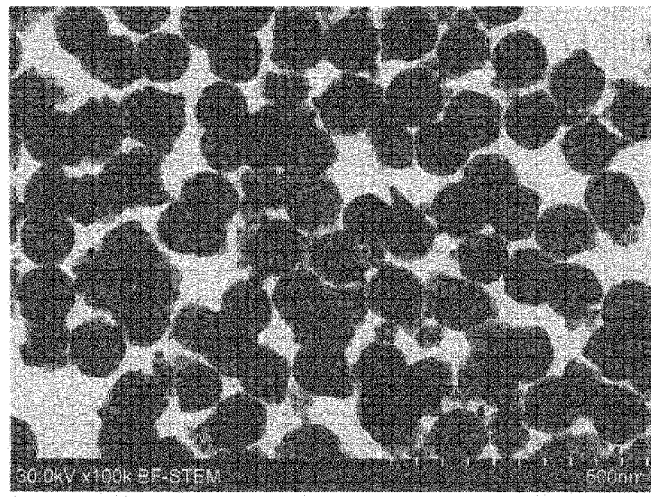

From the SEM image and TEM image in FIGS. 3(a) and (b), and from the X-ray diffraction peak in FIG. 4, the obtained particle was confirmed to be almost same as that in Example 1. Since the particle of Example 6, originated from sodium silicate, has the Na content slightly higher than that of the particle in Example 1, so that the silica-based composite particle tends to have an excessively large crystallite size unless it is calcined at slightly lower temperatures. The calcination was thus conducted at 1,070° C.

Example 6

Example 6 was conducted in the same way as in Example 1, except that the amount of consumption of Liquid B was altered to 14,400 g (equivalent to 200 parts by mass of $CeO_2$ per 100 parts by mass of $SiO_2$). Also measurements and so forth were conducted in the same way.

Results are shown in Table 1.

Example 7

Example 7 was conducted in the same way as in Example 1, except that the amount of consumption of Liquid B was altered to 18,000 g (equivalent to 250 parts by mass of $CeO_2$ per 100 parts by mass of $SiO_2$). Also measurements and so forth were conducted in the same way.

Results are shown in Table 1.

Example 8

Preparation of <<Silica Particle Dispersion Liquid (Average Particle Size of Silica Particle: 270 nm)>>

(Step of Preparing Seed Particle)

First, water, alcohol and an additional hydrolytic catalyst were added to prepare a mixed solvent. In this Example, 4,424 g of water, 3,702 g of ethanol (from Kanto Chemical Co., Inc.), and 762 g of a 28% by mass aqueous ammonia (from Kanto Chemical Co., Inc., as an exemplary hydrolytic catalyst) were placed in a 2 L ("L" represents liter, the same will apply hereinafter) glass reactor, and stirred. The liquid was conditioned at a temperature of 35±0.5° C., and 157.6 g of tetraethoxysilane (from Tama Chemicals Co., Ltd., an exemplary silicon-containing compound) was charged all at once into the reactor. The content was then stirred for one hour. As a result of one-hour stirring, tetraethoxysilane was hydrolyzed and condensed, and thereby a dispersion liquid (Liquid A) of silica particle (seed particle) was obtained. The silica particle was found to have an average particle size of 83 nm.

In order to adjust pH of the dispersion liquid (Liquid A) of silica particle, 1,222 g of a 28% by weight aqueous ammonia (from Kanto Chemical Co., Inc., an exemplary pH control agent) and 200 g of water were added, and the mixture was conditioned at 35±0.5° C. under stirring. A dispersion liquid (Liquid B) of silica particle was thus obtained. The dispersion liquid (Liquid B) was found to be pH12.2, and to have an electric conductivity of 196 μS/cm.

(Particle Growth Step)

As a hydrolyzable silicon-containing compound for particle growth, 9,940 g of tetraethoxysilane was placed in a first dropping device. In a second dropping device, 8,820 g of an 8% by mass aqueous ammonia (an exemplary hydrolytic catalyst) was placed. Into the dispersion liquid (Liquid B) conditioned at 35±0.5° C., tetraethoxysilane and aqueous ammonia were added dropwise over 12 hours using the first dropping device and the second dropping device. The pH during the dropping period was controlled so as not to fall below 11.5. A dispersion liquid (Liquid C) of silica particle, after completion of the dropping process, was found to have an electric conductivity of 96.1 µS/cm, and again found to be kept so as not to fall below 90 µS/cm during the dropping period.

(Particle Ripening Step)

Upon completion of the dropping process, the dispersion liquid (Liquid C) of silica particle was conditioned at 60±0.5° C., ripened for one hour under stirring, to prepare a dispersion liquid (Liquid D) of silica particle (A1). The silica particle (A1), was found to have an average particle size of 270 nm, when measured using a laser diffraction/scattering particle size analyzer LA-950, from HORIBA Ltd. The dispersion liquid at that time was found to be pH11.7.

(Filtration/Water Replacement Step)

The thus obtained dispersion liquid (Liquid D) of the silica particle (A1) was filtered through a 0.5 µm nylon filter, to remove an agglomerated portion of the silica particle. The liquid phase was then replaced with water using a distillation device. The dispersion liquid was then condensed up to a silica concentration of 35% by mass, to thereby obtain a dispersion liquid (Liquid D') of the silica particle (A1). The thus obtained dispersion liquid (Liquid D') of silica particle (A1) was found to be pH8.05, and has an electric conductivity of 106 (µS/cm).

(Hydrothermal Pre-Purification Step)

Stirred was 8,000 g of the dispersion liquid (Liquid D') of silica particle (A1), and therein 2,460 g of a cation exchange resin (Duolite C255LFH, from Rohm and Haas Company) was placed. The placement was followed by stirring for 10 minutes, and the resin was separated on a stainless steel screen (mesh size: 325). The separated resin was rinsed with 200 g of pure water used as a rinsing liquid, and the rinsate was collected in the same way. The thus obtained 7,060 g of dispersion liquid (E-1) of the silica particle (A1) was found to be pH3.56, and to have an electric conductivity of 35.4 µS/cm. Succeedingly, into the dispersion liquid (E-1) of the silica particle (A1), 580 g of an anion exchange resin (Duolite UP5000, from Rohm and Haas Company) was placed, the mixture was stirred for 10 minutes, and the resin was separated on a stainless steel screen (mesh size: 325). The separated resin was rinsed with 400 g of pure water used as a rinsing liquid, and the rinsate was collected in the same way. The thus obtained 7,180 g of dispersion liquid (E-2) of the silica particle (A1) was found to have a particle size of 0.27 µm, a solid content concentration of 32.0% by mass, a pH of 4.18, and an electric conductivity of 5.2 µS/cm. Succeedingly, 6,240 g of the dispersion liquid (E-2) of the silica particle (A1) is kept stirred, and therein 120 g of a cation exchange resin (Duolite C255LFH, from Rohm and Haas Company) was placed. The placement was followed by stirring for 10 minutes, and the resin was separated on a stainless steel screen (mesh size: 325). The thus obtained 6,160 g of dispersion liquid (E-3) of the silica particle (A1) was found to have a solid content concentration of 32.0% by mass, a pH of 3.92, and an electric conductivity of 11.8 µS/cm. Succeedingly, 5,340 g of the dispersion liquid (E-3) of the silica particle (A1) was kept stirred, and therein 100 g of an anion exchange resin (Duolite UP5000, from Rohm and Haas Company) was placed. The placement was followed by stirring for 10 minutes, and the resin was separated on a stainless steel screen (mesh size: 325). The thus obtained 5,340 g of dispersion liquid (Liquid E) of the silica particle (A1) was found to have a solid content concentration of 32.0% by mass, a pH of 4.07, and an electric conductivity of 7.81 µS/cm.

(Hydrothermal Treatment Step)

To 5,000 g of the dispersion liquid (Liquid E) of the silica particle (A1) obtained in the hydrothermal pre-purification step, 11,000 g of pure water was added under stirring for dilution, to thereby adjust the solid content concentration to 10% by mass. To 16,000 g of the thus diluted liquid, 148 g of a 28% by weight aqueous ammonia (from Kanto Chemical Co., Inc.) was added, to adjust the pH to 12.5. The electric conductivity measured at that time was found to be 343 µS/cm. The liquid was then filled in a small pressure vessel (Model TAS-50, from Taiatsu Techno Corporation), and treated at a pressure of 1.6 MPa, an agitation speed of 200 rpm, and a heating temperature of 200° C. for 11 hours. After cooled down to room temperature, 15,976 g of a dispersion liquid (Liquid F) of the silica particle (A1) was taken out, which was found to have a solid content concentration of 9.9% by mass, a pH of 10.51, and an electric conductivity of 887 µS/cm.

(Hydrothermal Post-Purification Step)

The thus hydrothermally treated dispersion liquid (Liquid F) of the silica particle (A1) was subjected to ion exchange, in the same way as in the hydrothermal pre-purification step. The ion exchange was conducted in the order of cation exchange, anion exchange, cation exchange and anion exchange, the liquid was then condensed using a distillation device, to obtain a dispersion liquid (Liquid G) of the high-purity silica particle (A1), having a particle size measured by the laser diffraction/scattering method of 270 nm, a solid content concentration of 35.0% by mass, a pH of 4.00, and an electric conductivity of 8.00 µS/cm. All of the content rates of alkali earth metals measured by atomic absorption spectrometry or ICP atomic emission spectrometry, and the content rates of U, Th, Cl, $NO_3$, $SO_4$ and F measured by potentiometric titration or ion chromatography, were 1 ppm or below.

Next, the procedures were conducted in the same way as in Example 1, except that the above-obtained dispersion liquid of the silica particle having an average particle size of 270 nm was used as the source silica particle dispersion liquid, in place of "Liquid A" used in Example 1. Also measurements were conducted in the same way.

Results are shown in Table 1.

Comparative Example 1

Using Liquid A (silica particle dispersion liquid having a silica particle with an average particle size of 108 nm dispersed in water [$SiO_2$ solid content concentration=3% by mass]) prepared in Example 1, the measurement was conducted in the same way as in Example 1.

Results are shown in Table 1.

Comparative Example 2

Using Liquid A (silica particle dispersion liquid having an irregular-shaped silica particle with an average particle size of 35 nm dispersed in water [$SiO_2$ solid content concentration=3% by mass]) prepared in Example 4, the measurement was conducted in the same way as in Example 1.

Results are shown in Table 1.

Comparative Example 3

Using Liquid A (silica particle dispersion liquid having a silica particle with an average particle size of 96 nm dispersed in water [$SiO_2$ solid content concentration=3% by mass]) prepared in Example 5, the measurement was conducted in the same way as in Example 1.

Results are shown in Table 1.

Comparative Example 4

In Comparative Example 4, operations were conducted in the same way as in Example 1, except that the amount of consumption of Liquid B was set to 360 g (equivalent to 5 parts by mass of $CeO_2$, per 100 parts by mass of $SiO_2$). The yield was, however, considerably poor since the grain grew abnormally and was hard to be wet-ground. Results are shown in Table 1.

The dispersion liquid of a silica-based composite particle obtained in Comparative Example 4 was observed under a SEM and a TEM. A SEM image and a TEM image (100,000×) were shown in FIGS. 5(a) and (b), respectively.

Figure 6:
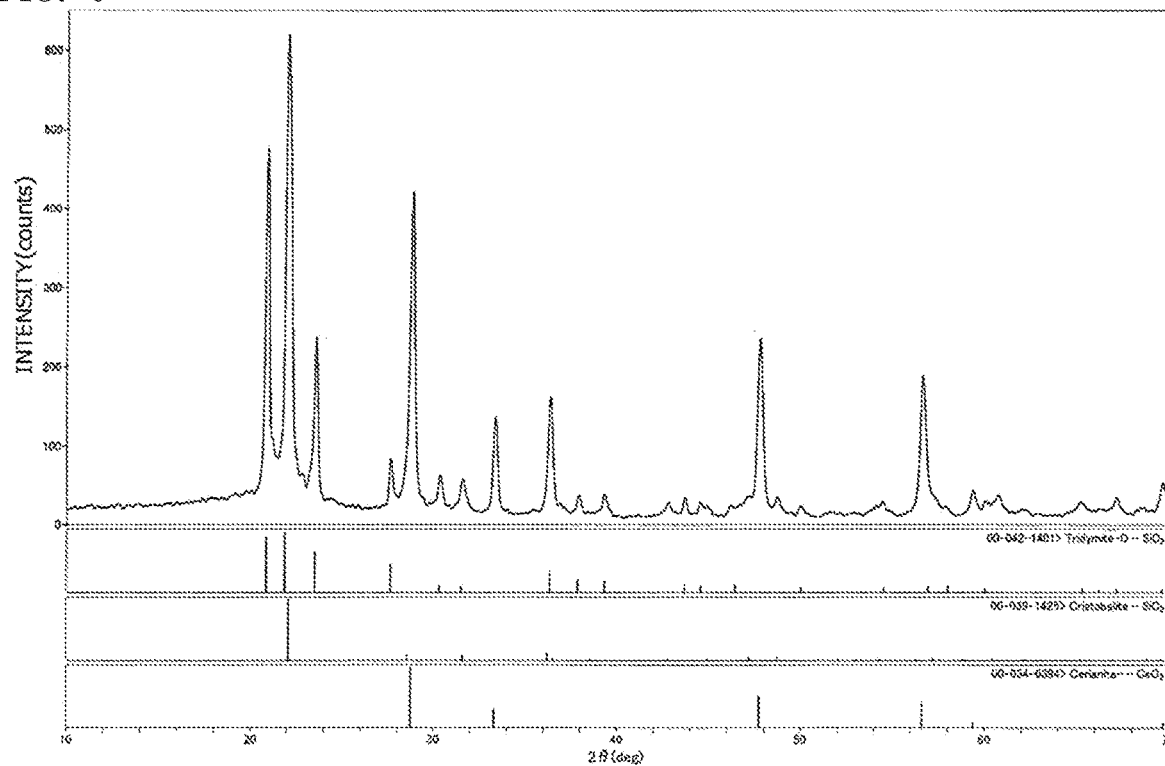
FIG. 6 An X-ray diffraction pattern obtained in Comparative Example 4.

An X-ray diffraction pattern of the silica-based composite particle, contained in the dispersion liquid of a silica-based composite particle obtained in Comparative Example 4, is shown in FIG. 6.

Figure 5:
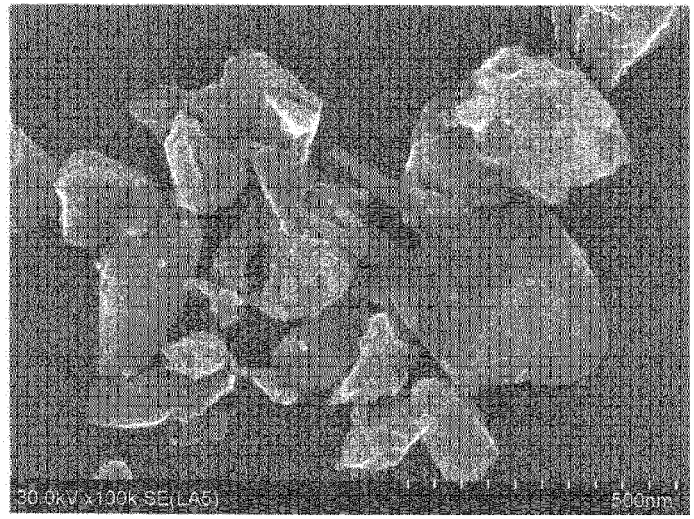
FIG. 5(a) is a SEM image obtained in Comparative Example 4.
FIG. 5(b) is a TEM image obtained in Comparative Example 4.
Figure 5:
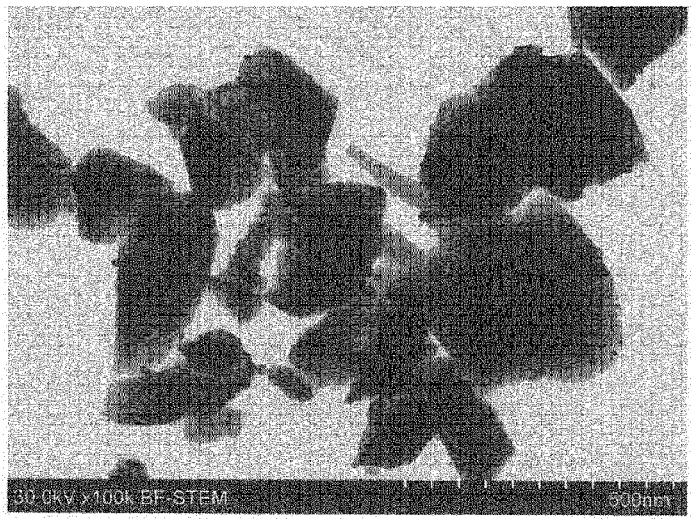

It is observed from FIGS. 5(a) and (b) that the particles of Comparative Example 4 become large irregular-shaped particles, deformed from the original spherical shape.

It is presumably because the core particles are likely to fuse with each other, due to insufficient amount of ceria for coverage.

It is also observed from the X-ray diffractogram in FIG. 6 that there is produced crystobalite besides the crystalline cerium oxide, but again presumably due to insufficient amount of ceria for coverage, the core particles became more likely to fuse with each other to deform themselves, or the core particles crystallized.

Comparative Example 5

In Comparative Example 5, operations were conducted in the same way as in Example 1, except that the amount of consumption of Liquid B was set to 28,801 g (equivalent to 400 parts by mass of $CeO_2$ per 100 parts by mass of $SiO_2$). Also measurements were conducted in the same way as in Example 1. Results are shown in Table 1.

TABLE 1

| | Measured Items | | Method of measurement | Unit | Example 1 | Example 2 | Example 3 |
|---|---|---|---|---|---|---|---|
| Silica core particle | Average particle size of silica particle (core particle) | | PAR-III, from Otsuka Electronics Co., Ltd. | nm | 103 | 106 | 108 |
| | Ratio of the number of silica particle (core particle) with short diameter/long diameter value of 0.8 or smaller | | TEM | % | 0 | 0 | 0 |
| | Property of silica particle (core particle) | | X-ray diffractometry | — | Amorphous | Amorphous | Amorphous |
| | Impurity content in silica core particle (dry weight) | Na | Atomic absorption | ppm | ≤1 ppm | ≤1 ppm | ≤1 ppm |
| | | Ag | ICP | ppm | ≤1 ppm | ≤1 ppm | ≤1 ppm |
| | | Al | ICP | ppm | ≤1 ppm | ≤1 ppm | ≤1 ppm |
| | | Ca | ICP | ppm | ≤1 ppm | ≤1 ppm | ≤1 ppm |
| | | Cr | ICP | ppm | ≤1 ppm | ≤1 ppm | ≤1 ppm |
| | | Cu | ICP | ppm | ≤1 ppm | ≤1 ppm | ≤1 ppm |
| | | Fe | ICP | ppm | ≤1 ppm | ≤1 ppm | ≤1 ppm |
| | | K | Atomic absorption | ppm | ≤1 ppm | ≤1 ppm | ≤1 ppm |
| | | Mg | ICP | ppm | ≤1 ppm | ≤1 ppm | ≤1 ppm |
| | | Ni | ICP | ppm | ≤1 ppm | ≤1 ppm | ≤1 ppm |
| | | Ti | ICP | ppm | ≤1 ppm | ≤1 ppm | ≤1 ppm |
| | | Zn | ICP | ppm | ≤1 ppm | ≤1 ppm | ≤1 ppm |
| | | Zr | ICP | ppm | ≤1 ppm | ≤1 ppm | ≤1 ppm |
| | | U | ICP | ppm | ≤1 ppm | ≤1 ppm | ≤1 ppm |
| | | Th | ICP | ppm | ≤1 ppm | ≤1 ppm | ≤1 ppm |
| | | $SO_4$ | Ion chromatography | ppm | ≤1 ppm | ≤1 ppm | ≤1 ppm |
| | | $NO_3$ | Ion chromatography | ppm | ≤1 ppm | ≤1 ppm | ≤1 ppm |
| | | Cl | Potentiometric titration | ppm | ≤1 ppm | ≤1 ppm | ≤1 ppm |
| | | F | Ion chromatography | ppm | ≤1 ppm | ≤1 ppm | ≤1 ppm |
| Silica-based composite | Content rate of $SiO_2$ in silica-based composite particle (% by mass) | | | % | 46.1 | 77 | 87 |
| | Content rate of $CoO_2$ in silica-based composite particle (% by mass) | | | % | 53.9 | 23 | 13 |
| | Ceria content per 100 parts by mass of silica | | ICP | % | 117.4 | 29.0 | 15 |
| | Calcination temperature | | — | — | 1090 | 1000 | 1000 |
| | Crystalute size | | X-ray diffractometry | nm | 15 | 13 | 12 |
| | Average particle size of ceria particle | | TEM | nm | 18 | 16 | 14 |
| | Specific surface area of composite particle | | BET | m²/g | 37 | 44 | 50 |
| | Crystal structure | | X-ray diffractometry | — | Cerianite | Cerianite | Cerianite |
| | Impurity content of silica-based composite particle | Na | Atomic absorption | ppm | ≤1 ppm | ≤1 ppm | ≤1 ppm |
| | | Ag | ICP | ppm | ≤1 ppm | ≤1 ppm | ≤1 ppm |
| | | Al | ICP | ppm | ≤1 ppm | ≤1 ppm | ≤1 ppm |
| | | Ca | ICP | ppm | ≤1 ppm | ≤1 ppm | ≤1 ppm |
| | | Cr | ICP | ppm | ≤1 ppm | ≤1 ppm | ≤1 ppm |
| | | Cu | ICP | ppm | ≤1 ppm | ≤1 ppm | ≤1 ppm |
| | | Fe | ICP | ppm | ≤1 ppm | ≤1 ppm | ≤1 ppm |

TABLE 1-continued

|  |  |  |  |  |  |  |
|---|---|---|---|---|---|---|
|  | K | Atomic absorption | ppm | ≤1 ppm | ≤1 ppm | ≤1 ppm |
|  | Mg | ICP | ppm | ≤1 ppm | ≤1 ppm | ≤1 ppm |
|  | Ni | ICP | ppm | ≤1 ppm | ≤1 ppm | ≤1 ppm |
|  | Ti | ICP | ppm | ≤1 ppm | ≤1 ppm | ≤1 ppm |
|  | Zn | ICP | ppm | ≤1 ppm | ≤1 ppm | ≤1 ppm |
|  | Zr | ICP | ppm | ≤1 ppm | ≤1 ppm | ≤1 ppm |
|  | U | ICP | ppm | ≤1 ppm | ≤1 ppm | ≤1 ppm |
|  | Th | ICP | ppm | ≤1 ppm | ≤1 ppm | ≤1 ppm |
|  | $SO_4$ | Ion chromatography | ppm | ≤1 ppm | ≤1 ppm | ≤1 ppm |
|  | $NO_3$ | Ion chromatography | ppm | ≤1 ppm | ≤1 ppm | ≤1 ppm |
|  | Cl | Potentiometric titration | ppm | ≤1 ppm | ≤1 ppm | ≤1 ppm |
|  | F | Ion chromatography | ppm | ≤1 ppm | ≤1 ppm | ≤1 ppm |
| Average particle size | | Microtrac UPA | nm | 230→226 | 170 | 160 |
| Population ratio of particles with short diameter/long diameter value of 0.8 or smaller | | — | % | 76 | 60 | 55 |
| Results of polishing of thermally oxidezed film | Polishing rate | nm/min | nm/min | 430 | 150 | 120 |
| | Surface roughness (Ra) | nm | nm | 0.11 | 0.14 | 0.15 |
| | Scratch | | | Not clearly observed | Not clearly observed | Not clearly observed |
| Results of polishing of aluminum hard disk | Scratch | | | Few | Few | Few |

| | Measured Items | | Example 4 | Example 5 | Example 6 | Example 7 | Example 8 |
|---|---|---|---|---|---|---|---|
| Silica core particle | Average particle size of silica particle (core particle) | | 35 | 96 | 108 | 108 | 270 |
| | Ratio of the number of silica particle (core particle) with short diameter/long diameter value of 0.8 or smaller | | 41 | 0 | 0 | 0 | 0 |
| | Property of silica particle (core particle) | | Amorphous | Amorphous | Amorphous | Amorphous | Amorphous |
| Impurity content in silica core particle (dry weight) | | Na | ≤1 ppm | 42 | ≤1 ppm | ≤1 ppm | ≤1 ppm |
| | | Ag | ≤1 ppm | ≤1 ppm | ≤1 ppm | ≤1 ppm | ≤1 ppm |
| | | Al | ≤1 ppm | 83 | ≤1 ppm | ≤1 ppm | ≤1 ppm |
| | | Ca | ≤1 ppm | 17 | ≤1 ppm | ≤1 ppm | ≤1 ppm |
| | | Cr | ≤1 ppm | ≤1 ppm | ≤1 ppm | ≤1 ppm | ≤1 ppm |
| | | Cu | ≤1 ppm | ≤1 ppm | ≤1 ppm | ≤1 ppm | ≤1 ppm |
| | | Fe | ≤1 ppm | 17 | ≤1 ppm | ≤1 ppm | ≤1 ppm |
| | | K | ≤1 ppm | ≤1 ppm | ≤1 ppm | ≤1 ppm | ≤1 ppm |
| | | Mg | ≤1 ppm | ≤1 ppm | ≤1 ppm | ≤1 ppm | ≤1 ppm |
| | | Ni | ≤1 ppm | ≤1 ppm | ≤1 ppm | ≤1 ppm | ≤1 ppm |
| | | Ti | ≤1 ppm | 75 | ≤1 ppm | ≤1 ppm | ≤1 ppm |
| | | Zn | ≤1 ppm | ≤1 ppm | ≤1 ppm | ≤1 ppm | ≤1 ppm |
| | | Zr | ≤1 ppm | ≤1 ppm | ≤1 ppm | ≤1 ppm | ≤1 ppm |
| | | U | ≤1 ppm | ≤1 ppm | ≤1 ppm | ≤1 ppm | ≤1 ppm |
| | | Th | ≤1 ppm | ≤1 ppm | ≤1 ppm | ≤1 ppm | ≤1 ppm |
| | | $SO_4$ | ≤1 ppm | ≤1 ppm | ≤1 ppm | ≤1 ppm | ≤1 ppm |
| | | $NO_3$ | ≤1 ppm | ≤1 ppm | ≤1 ppm | ≤1 ppm | ≤1 ppm |
| | | Cl | ≤1 ppm | ≤1 ppm | ≤1 ppm | ≤1 ppm | ≤1 ppm |
| | | F | ≤1 ppm | ≤1 ppm | ≤1 ppm | ≤1 ppm | ≤1 ppm |
| Silica-based composite | Content rate of $SiO_2$ in silica-based composite particle (% by mass) | | 75 | 46.1 | 33.3 | 28.6 | 46.1 |
| | Content rate of $CoO_2$ in silica-based composite particle (% by mass) | | 25 | 53.9 | 88.7 | 71.4 | 53.9 |
| | Ceria content per 100 parts by mass of silica | | 33.3 | 117.4 | 200 | 250 | 117.4 |
| | Calcination temperature | | 1090 | 1070 | 1090 | 1090 | 1000 |
| | Crystalute size | | 13 | 15 | 16 | 17 | 15 |
| | Average particle size of ceria particle | | 13 | 18 | 19 | 20 | 18 |
| | Specific surface area of composite particle | | 65 | 26 | 27 | 25 | 23 |
| | Crystal structure | | Cerianite | Cerianite | Cerianite | Cerianite | Cerianite |
| Impurity content of silica-based composite particle | | Na | ≤1 ppm | 19 | ≤1 ppm | ≤1 ppm | ≤1 ppm |
| | | Ag | ≤1 ppm | ≤1 ppm | ≤1 ppm | ≤1 ppm | ≤1 ppm |
| | | Al | ≤1 ppm | 38 | ≤1 ppm | ≤1 ppm | ≤1 ppm |
| | | Ca | ≤1 ppm | 8 | ≤1 ppm | ≤1 ppm | ≤1 ppm |
| | | Cr | ≤1 ppm | ≤1 ppm | ≤1 ppm | ≤1 ppm | ≤1 ppm |
| | | Cu | ≤1 ppm | ≤1 ppm | ≤1 ppm | ≤1 ppm | ≤1 ppm |
| | | Fe | ≤1 ppm | 8 | ≤1 ppm | ≤1 ppm | ≤1 ppm |
| | | K | ≤1 ppm | ≤1 ppm | ≤1 ppm | ≤1 ppm | ≤1 ppm |
| | | Mg | ≤1 ppm | ≤1 ppm | ≤1 ppm | ≤1 ppm | ≤1 ppm |
| | | Ni | ≤1 ppm | ≤1 ppm | ≤1 ppm | ≤1 ppm | ≤1 ppm |
| | | Ti | ≤1 ppm | 35 | ≤1 ppm | ≤1 ppm | ≤1 ppm |

TABLE 1-continued

|  |  |  | | | | | |
|---|---|---|---|---|---|---|---|
|  |  | Zn | ≤1 ppm | ≤1 ppm | ≤1 ppm | ≤1 ppm | ≤1 ppm |
|  |  | Zr | ≤1 ppm | ≤1 ppm | ≤1 ppm | ≤1 ppm | ≤1 ppm |
|  |  | U | ≤1 ppm | ≤1 ppm | ≤1 ppm | ≤1 ppm | ≤1 ppm |
|  |  | Th | ≤1 ppm | ≤1 ppm | ≤1 ppm | ≤1 ppm | ≤1 ppm |
|  |  | $SO_4$ | ≤1 ppm | ≤1 ppm | ≤1 ppm | ≤1 ppm | ≤1 ppm |
|  |  | $NO_3$ | ≤1 ppm | ≤1 ppm | ≤1 ppm | ≤1 ppm | ≤1 ppm |
|  |  | Cl | ≤1 ppm | ≤1 ppm | ≤1 ppm | ≤1 ppm | ≤1 ppm |
|  |  | F | ≤1 ppm | ≤1 ppm | ≤1 ppm | ≤1 ppm | ≤1 ppm |
|  | Average particle size | | 90 | 220→215 | 265→260 | 285→280 | 340→330 |
|  | Population ratio of particles with short diameter/long diameter value of 0.8 or smaller | | 93 | 75 | 84 | 84 | 75 |
| Results of polishing of thermally oxidezed film | Polishing rate | | 180 | 425 | 490 | 500 | 520 |
|  | Surface roughness (Ra) | | 0.13 | 0.11 | 0.13 | 0.15 | 0.12 |
|  | Scratch | | Not clearly observed | Not clearly observed | Not clearly observed | Not clearly observed | Not clearly observed |
| Results of polishing of aluminum hard disk | Scratch | | Few | Few | Few | Few | Few |

| | Measured Items | | Comparative Example 1 | Comparative Example 2 | Comparative Example 3 | Comparative Example 4 | Comparative Example 5 |
|---|---|---|---|---|---|---|---|
| Silica core particle | Average particle size of silica particle (core particle) | | 108 | 35 | 86 | 106 | 108 |
|  | Ratio of the number of silica particle (core particle) with short diameter/long diameter value of 0.8 or smaller | | 0 | 41 | 0 | 0 | 0 |
|  | Property of silica particle (core particle) | | Amorphous | Amorphous | Amorphous | Amorphous | Amorphous |
|  | Impurity content in silica core particle (dry weight) | Na | ≤1 ppm | ≤1 ppm | 42 | ≤5 ppm → ≤1 ppm | ≤1 ppm |
|  |  | Ag | ≤1 ppm | ≤1 ppm | ≤1 ppm | ≤1 ppm | ≤1 ppm |
|  |  | Al | ≤1 ppm | ≤1 ppm | 83 | ≤1 ppm | ≤1 ppm |
|  |  | Ca | ≤1 ppm | ≤1 ppm | 17 | ≤1 ppm | ≤1 ppm |
|  |  | Cr | ≤1 ppm | ≤1 ppm | ≤1 ppm | ≤1 ppm | ≤1 ppm |
|  |  | Cu | ≤1 ppm | ≤1 ppm | ≤1 ppm | ≤1 ppm | ≤1 ppm |
|  |  | Fe | ≤1 ppm | ≤1 ppm | 17 | ≤1 ppm | ≤1 ppm |
|  |  | K | ≤1 ppm | ≤1 ppm | ≤1 ppm | ≤1 ppm | ≤1 ppm |
|  |  | Mg | ≤1 ppm | ≤1 ppm | ≤1 ppm | ≤1 ppm | ≤1 ppm |
|  |  | Ni | ≤1 ppm | ≤1 ppm | ≤1 ppm | ≤1 ppm | ≤1 ppm |
|  |  | Ti | ≤1 ppm | ≤1 ppm | 75 | ≤1 ppm | ≤1 ppm |
|  |  | Zn | ≤1 ppm | ≤1 ppm | ≤1 ppm | ≤1 ppm | ≤1 ppm |
|  |  | Zr | ≤1 ppm | ≤1 ppm | ≤1 ppm | ≤1 ppm | ≤1 ppm |
|  |  | U | ≤1 ppm | ≤1 ppm | ≤1 ppm | ≤1 ppm | ≤1 ppm |
|  |  | Th | ≤1 ppm | ≤1 ppm | ≤1 ppm | ≤1 ppm | ≤1 ppm |
|  |  | $SO_4$ | ≤1 ppm | ≤1 ppm | ≤1 ppm | ≤1 ppm | ≤1 ppm |
|  |  | $NO_3$ | ≤1 ppm | ≤1 ppm | ≤1 ppm | ≤1 ppm | ≤1 ppm |
|  |  | Cl | ≤1 ppm | ≤1 ppm | ≤1 ppm | ≤1 ppm | ≤1 ppm |
|  |  | F | ≤1 ppm | ≤1 ppm | ≤1 ppm | ≤1 ppm | ≤1 ppm |
| Silica-based composite | Content rate of $SiO_2$ in silica-based composite particle (% by mass) | | 100 | 100 | 100 | 95.2 | 20 |
|  | Content rate of $CoO_2$ in silica-based composite particle (% by mass) | | 0 | 0 | 0 | 4.8 | 50 |
|  | Ceria content per 100 parts by mass of silica | | 0 | 0 | 0 | 5 | 400 |
|  | Calcination temperature | | 0⇒ — | 0⇒ — | 0⇒ — | 1070 | 1080 |
|  | Crystalute size | | — | — | — | — | 23 |
|  | Average particle size of ceria particle | | — | — | — | — | 26 |
|  | Specific surface area of composite particle | | 65 | — | 40 | 53 | 22 |
|  | Crystal structure | | Amorphous | Amorphous | Amorphous | Cerianite Cristobalite | Cerianite |
|  | Impurity content of silica-based composite particle | Na | ≤1 ppm | ≤1 ppm | 42 | ≤10 ppm→≤1 ppm | ≤1 ppm |
|  |  | Ag | ≤1 ppm | ≤1 ppm | ≤1 ppm | ≤1 ppm | ≤1 ppm |
|  |  | Al | ≤1 ppm | ≤1 ppm | 83 | ≤1 ppm | ≤1 ppm |
|  |  | Ca | ≤1 ppm | ≤1 ppm | 17 | ≤1 ppm | ≤1 ppm |
|  |  | Cr | ≤1 ppm | ≤1 ppm | ≤1 ppm | ≤1 ppm | ≤1 ppm |
|  |  | Cu | ≤1 ppm | ≤1 ppm | ≤1 ppm | ≤1 ppm | ≤1 ppm |
|  |  | Fe | ≤1 ppm | ≤1 ppm | 17 | ≤1 ppm | ≤1 ppm |
|  |  | K | ≤1 ppm | ≤1 ppm | ≤1 ppm | ≤1 ppm | ≤1 ppm |
|  |  | Mg | ≤1 ppm | ≤1 ppm | ≤1 ppm | ≤1 ppm | ≤1 ppm |
|  |  | Ni | ≤1 ppm | ≤1 ppm | ≤1 ppm | ≤1 ppm | ≤1 ppm |
|  |  | Ti | ≤1 ppm | ≤1 ppm | 75 | ≤1 ppm | ≤1 ppm |
|  |  | Zn | ≤1 ppm | ≤1 ppm | ≤1 ppm | ≤1 ppm | ≤1 ppm |
|  |  | Zr | ≤1 ppm | ≤1 ppm | ≤1 ppm | ≤1 ppm | ≤1 ppm |
|  |  | U | ≤1 ppm | ≤1 ppm | ≤1 ppm | ≤1 ppm | ≤1 ppm |

TABLE 1-continued

|  |  |  |  |  |  |  |
|---|---|---|---|---|---|---|
|  | Th | ≤1 ppm | ≤1 ppm | ≤1 ppm | ≤1 ppm | ≤1 ppm |
|  | SO₄ | ≤1 ppm | ≤1 ppm | ≤1 ppm | ≤1 ppm | ≤1 ppm |
|  | NO₃ | ≤1 ppm | ≤1 ppm | ≤1 ppm | ≤1 ppm | ≤1 ppm |
|  | Cl | ≤1 ppm | ≤1 ppm | ≤1 ppm | ≤1 ppm | ≤1 ppm |
|  | F | ≤1 ppm | ≤1 ppm | ≤1 ppm | ≤1 ppm | ≤1 ppm |
| Average particle size |  | — | — |  | (very poor yield in wet grinding) | 380→335 |
| Population ratio of particles with short diameter/long diameter value of 0.8 or smaller |  | — | — |  | 100 | 87 |
| Results of polishing of thermally oxidezed film | Polishing rate | 50 | 70 | 45 | 130 | 370 |
|  | Surface roughness (Ra) | 0.12 | 0.14 | 0.12 | 0.25 | 0.18 |
|  | Scratch | Not clearly observed | Not clearly observed | Not clearly observed | Too much to count | Much |
| Results of polishing of aluminum hard disk | Scratch | Very few | Very few | Very few | Too much to count | Much |

Experiment 2

Figure 7:
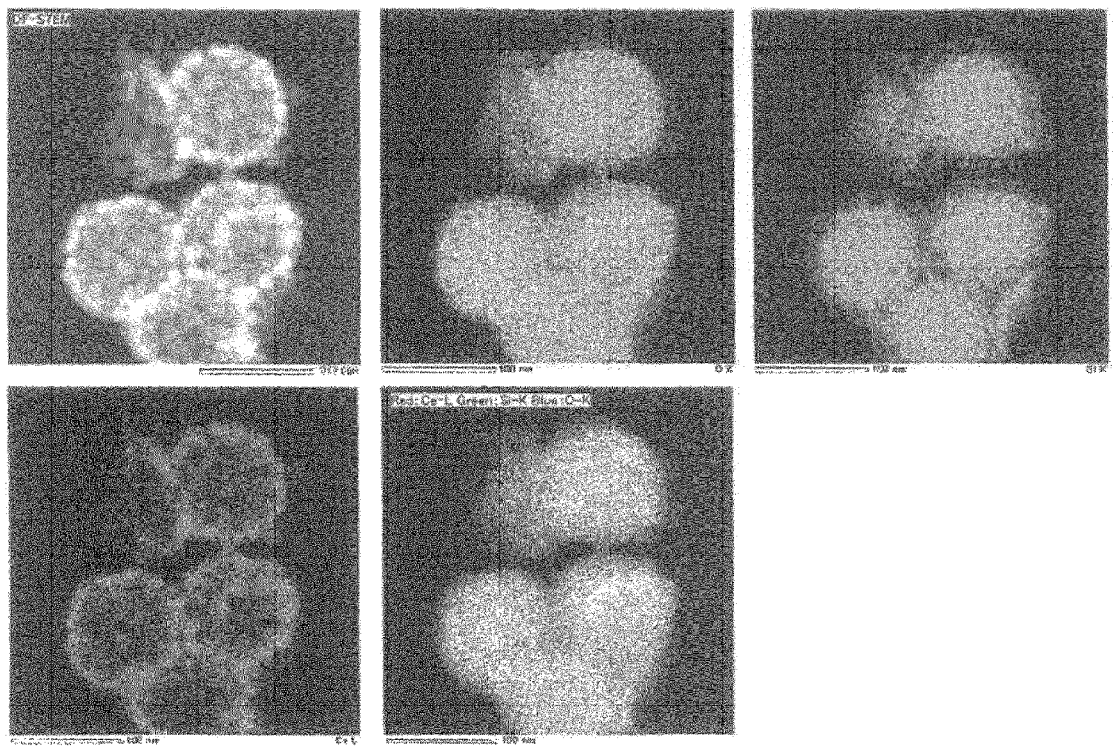
FIG. 7 Element distribution profiles of the silica-based composite particles obtained in Example 5, observed by EDS measurement.

The silica-based composite particle, contained in the dispersion liquid of a silica-based composite particle obtained in Example 5, was analyzed by energy dispersive X-ray spectrometry (EDS), to obtain an element distribution profile (FIG. 7).

Measurement conditions for energy dispersive X-ray spectrometry (EDS) are given below.

A sample was prepared by dispersing the silica-based composite particle in pure water, placing it on a Cu mesh with a carbon supporting film, and measured using a measuring instrument below.

Measuring instrument: UTW Si(Li) semiconductor detector from JEOL Ltd.

Beam diameter: 0.2 nm

It was confirmed, from the element distribution profiles shown in FIG. 7, that Si and O (oxygen) reside outside Ce elements (surface side of particles).

Next, the silica-based composite particle contained in the dispersion liquid of a silica-based composite particle obtained in Example 5 was observed under a transmission electron microscope (field-emission transmission electron microscope "JEM-2100F" from JEOL Ltd. (Cs-corrected), electron acceleration energy: 120 kV, magnification: 50,000×), to confirm that there is a film on the exterior of the ceria particles (ceria crystal grains). The film was then selectively irradiated with electron beam for EDS measurement.

Measurement conditions of energy dispersive X-ray spectrometry (EDS) are given below.

The silica-based composite particle was dispersed in pure water, placed on a Cu mesh with a carbon supporting film, and measured using a measuring instrument below.

Measuring instrument: UTW Si(Li) semiconductor detector from JEOL Ltd.

Beam diameter: 0.2 nm

Figure 8:
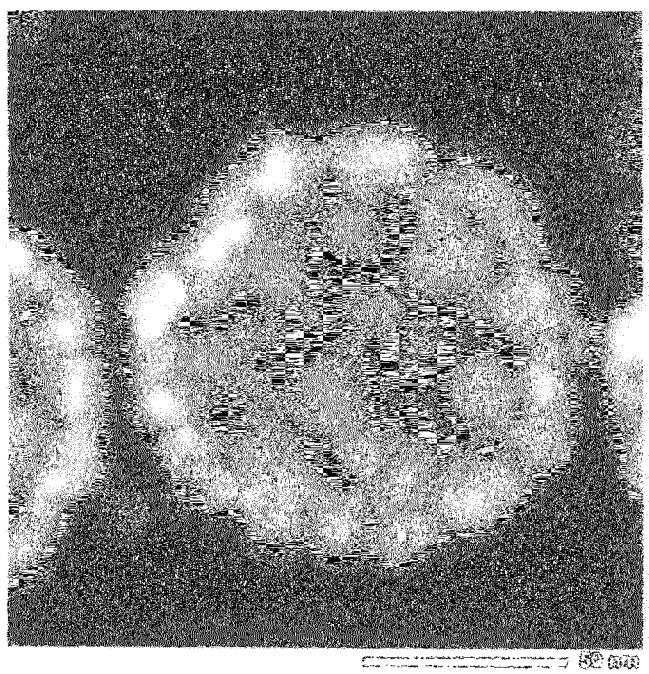
FIG. 8 A photograph (TEM image) obtained by observing the silica-based composite particle obtained in Example 5, under a transmission electron microscope.
Figure 9:
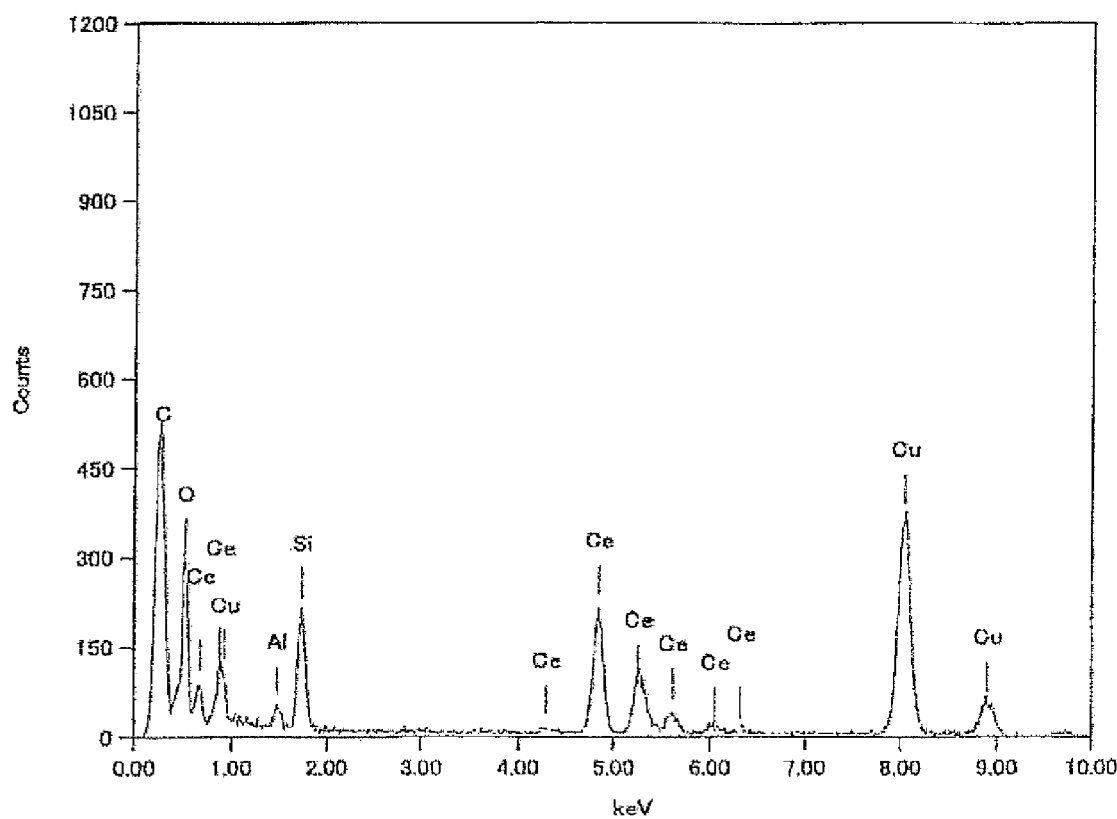
FIG. 9 An EDS chart of the silica-based composite particle obtained in Example 5, measured by selectively irradiating the silica film moiety with electron beam.

A photograph obtained by observation under the transmission electron microscope (TEM image) is shown in FIG. 8. A result of EDS measurement conducted by selectively irradiating the silica film on the exterior of the ceria particle (ceria crystal grain), observed in FIG. 8, with electron beam is shown in FIG. 9. As seen in FIG. 9, an intensity peak of Si appeared at 1.739 keV, and an intensity peak of Ce appeared at 4.839 keV. Accordingly, atomic percentage of Si was determined to be 23.22 atom %, atomic percentage of Ce was determined to be 25.64 atom %, and (atomic percentage of Si)/(atomic percentage of Ce) was determined to be 0.9056.

Example 9

Into a one-liter handled beaker, placed were 310 of the powder obtained after calcination in Example 1, and 430 g of deionized water, and thereto 10.3 g of a 3% aqueous ammonia solution was added, and the mixture was kept stirred and sonicated in a ultrasonic bath for 10 minutes, to obtain a suspension of pH9 (at 25° C.)

Next, into a grinding machine (LMZ06, from Ashizawa Finetech Ltd.), 595 g of 0.25 mm diameter quartz beads were placed, and the suspension was filled into a charge tank of the grinding machine (packing ratio=85%). Taking the deionized water remaining in a grinding chamber and a piping of the grinding machine into account, the concentration during grinding is estimated to be 25% by mass. Wet disintegration/grinding was carried out under the conditions including a peripheral speed of disk in the grinding machine of 12 m/sec, a number of passes of 25, and a residence time per pass of 0.43 minutes. In order to keep pH of the suspension at 9 during disintegration/grinding, a 3% aqueous ammonia solution was added for every pass. Operations thereafter were conducted in the same way as in Example 1, to obtain a dispersion liquid of a silica-based composite particle. The thus obtained dispersion liquid of a silica-based composite particle was measured in the same way as in Example 1, with respect to the average particle size of the silica-based composite particle, the crystal form (around 2θ=28°), the crystallite size (nm) and the specific surface area (m²/g). Also a polishing test was conducted in the same way as in Example 1, to measure the polishing rate. Results are shown in Table 2.

Comparative Example 6

Although the suspension during the disintegration/grinding in Example 9 was kept at pH9 by adding a 3% aqueous ammonia solution for every pass, disintegration in Comparative Example 6 was conducted while keeping the pH at 8.4 (at a temperature of 25° C.). Other operations and measurements were conducted in the same way as in Example 9. Results are shown in Table 2.

Comparative Example 7

Although the disintegration/grinding in Example 1 was conducted while controlling the peripheral speed of the disk in the grinding machine to 12 m/sec, and keeping the pH of the suspension during the disintegration/grinding at 10, the disintegration/grinding in Comparative Example 7 was conducted while controlling the peripheral speed of the disk in the grinding machine to 14 m/sec, and keeping the pH of the suspension during the disintegration/grinding at 11. During the disintegration/grinding, a 3% aqueous ammonia solution was added for every pass. Other operations and measurements were conducted in the same way as in Example 1. Results are shown in Table 2.

potential values at pH6, and at the point where the amount of consumption of cation colloidal titrant is 0 ml) of −349 mV and −582 mV, respectively, and Comparative Example 6 and Comparative Example 7 showed the values of −568 mV and −465.8 mV, respectively. All streaming potential values were found to be negative.

TABLE 2

|  | Example 1 | Example 9 | Comparative Example 6 | Comparative Example 7 |
| --- | --- | --- | --- | --- |
| pH of suspension | 10 | 9 | 9 | 11 |
| Peripheral speed of disk in grinding machine | 12 m/s | 12 m/s | 12 m/s | 14 |
| Final pH | 10 (Kept at initial value) | 9 (Kept at initial value) | 8.4 (Kept at initial value) | 11 (Kept at initial value) |
| Quartz bead | 0.25 mmΦ | 0.25 mmΦ | 0.25 mmΦ | 0.25 mmΦ |
| Concentration when charged for grinding | 0.25 | 0.25 | 0.25 | 0.25 |
| Packing ratio of bead (%) | 85 | 85 | 85 | 85 |
| Average particle size | 225 | 250 | 260 | 180 |
| Crystallite size | 15 | 14.8 | 15 | 14.2 |
| Crystal form (at around 2θ = 28°) | Cerianite | Cerianite | Cerianite | Cerianite |
| ΔPCD | −20 | −61.1 | −131.5 | −13.4 |
| Initial streaming potential mV (at pH6) | −349.1 | −582.2 | −568.1 | −465.8 |
| Polishing rate of silica film | 430 | 390 | 300 | 380 |

Experiment 3

The individual dispersion liquids of a silica-based composite particle obtained in Example 1, Example 9, Comparative Example 6 and Comparative Example 7 were subjected to measurement of streaming potential, and cation colloidal titration. As a titration device, used was an automatic titrator AT-510 (from Kyoto Electronics Manufacturing Co., Ltd.) equipped with a streaming potential titration unit (PCD-500).

First, the dispersion liquid of a silica-based composite particle, having been adjusted to the solid content concentration to 1% by mass, was conditioned at pH6 by adding a 0.05% aqueous hydrochloric acid solution. A volume of the liquid, equivalent to a solid content of 0.8 g, was sampled in a cell of a streaming potential measuring instrument, and the streaming potential was measured. Next, the liquid was titrated with a cation colloidal titrant (0.0025 N poly(diallyldimethylammonium chloride) solution). Plotting was made with the amount of consumption (ml) of the cation colloidal titrant scaled on the X-axis, and the streaming potential (mV) of the dispersion liquid of a silica-based composite particle scaled on the Y-axis, the streaming potential I (mV) at the start point of streaming potential curve, the streaming potential C (mV) at the knick, and the amount of consumption V (ml) of the cation colloidal titrant at the knick were determined, and ΔPCD/V=(I−C)/V was calculated. The results are shown in Table 2.

Figure 10:
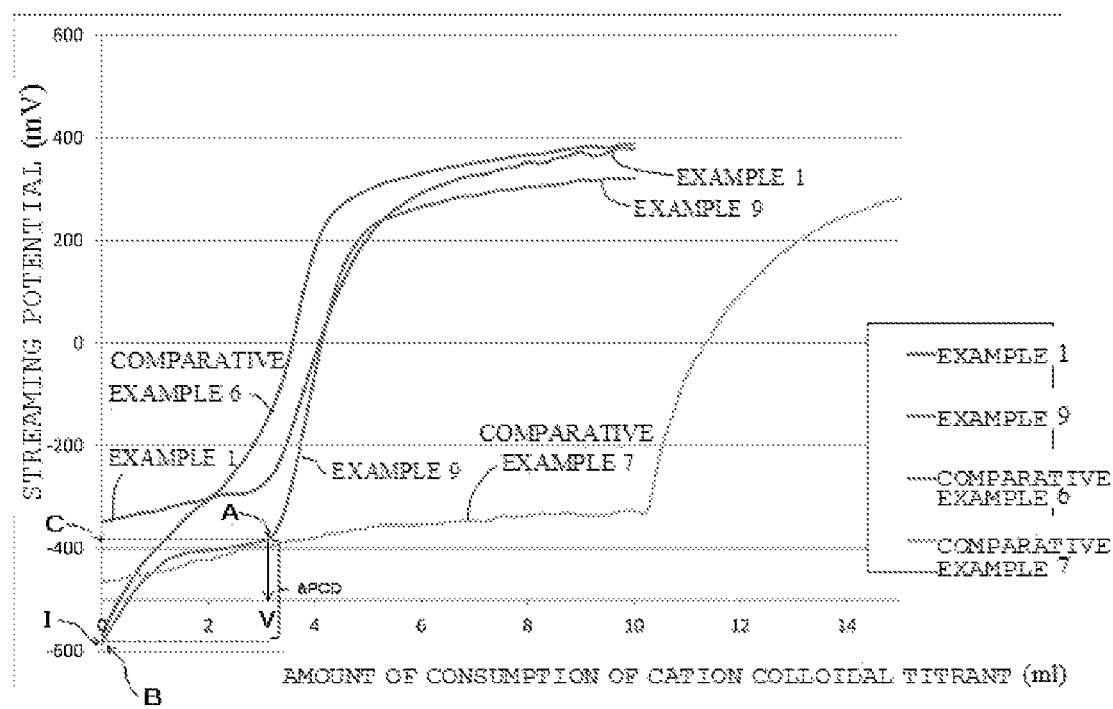
FIG. 10 Streaming potential curves obtained by cation colloidal titration in Examples 1, 9 and Comparative Examples 6, 7.
Figure 11:
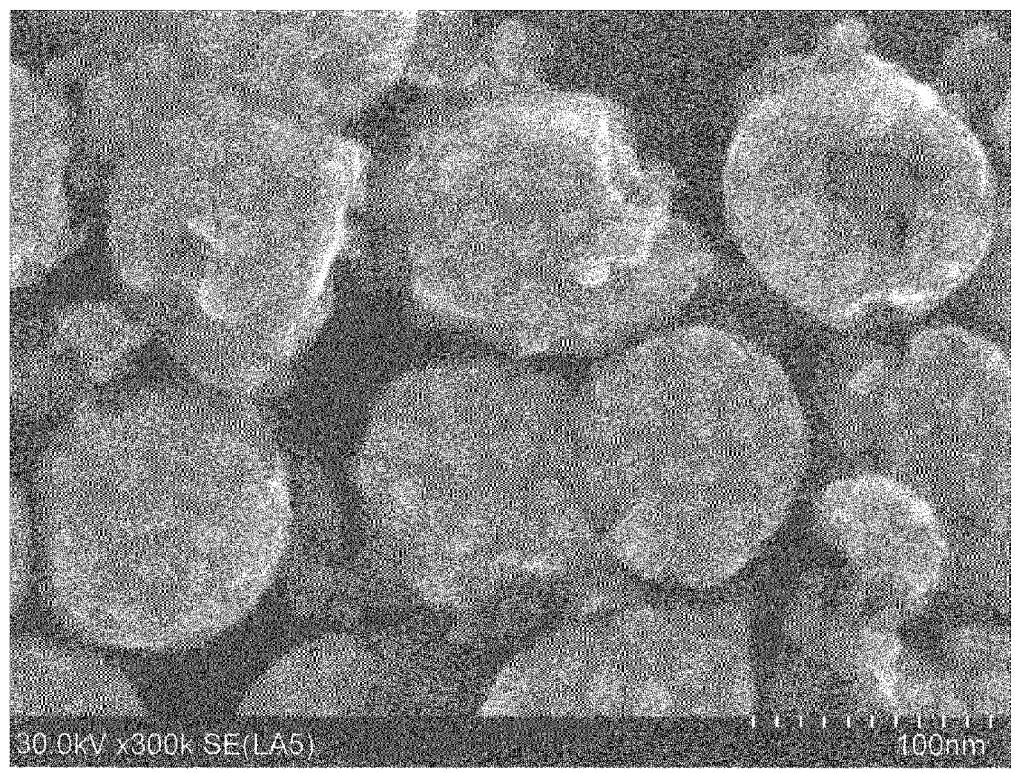
FIG. 11 A SEM image obtained in Example 1.

Streaming potential curves of Example 1, Example 9, Comparative Example 6 and Comparative Example 7 were shown in FIG. 10. As seen in FIG. 10, Example 1 and Example 9 showed streaming potential values of the dispersion liquid of a silica-based composite particle (streaming The silica-based composite particle contained in the individual dispersion liquids of silica-based composite particle in Example 1, Comparative Example 6 and Comparative Example 7 were observed under a SEM (at a 300,000× magnification). SEM images in Example 1, Comparative Example 6 and Comparative Example 7 were shown in FIG. 11, FIG. 12 and FIG. 13, respectively.

Figure 12:
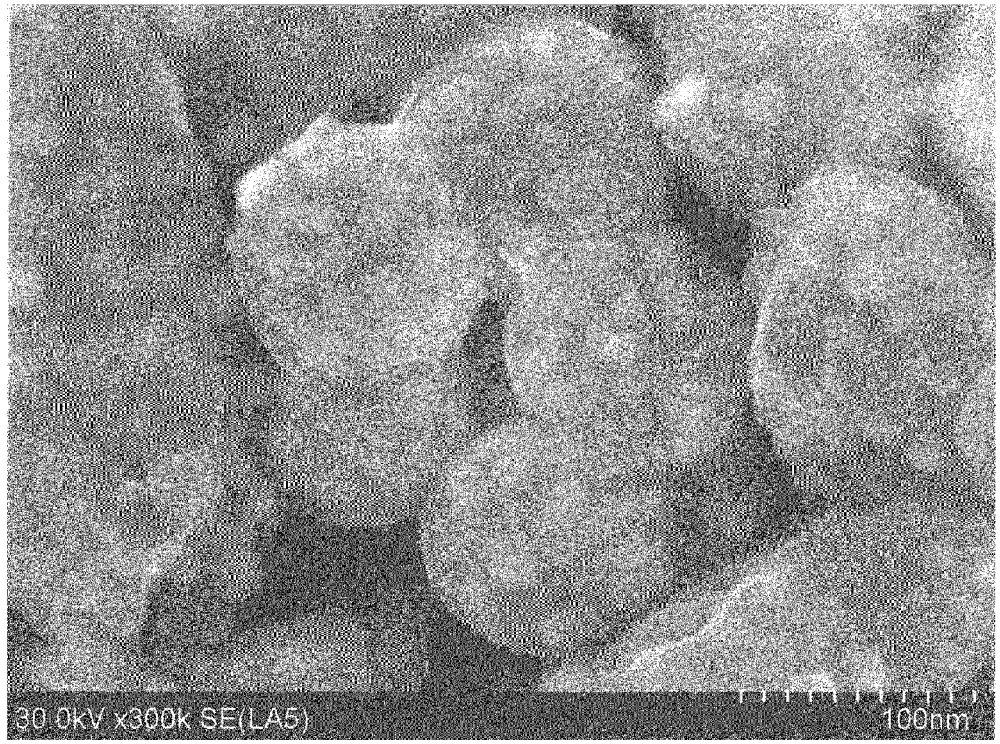
FIG. 12 A SEM image obtained in Comparative Example 6.

As seen in FIG. 12, the silica-based composite particle contained in the dispersion liquid of a silica-based composite particle in Comparative Example 6 caused almost no dropping of the ceria particle (ceria crystal grain) during the disintegration/grinding, wherein the ceria particle being covered with the silica film almost entirely.

Figure 13:
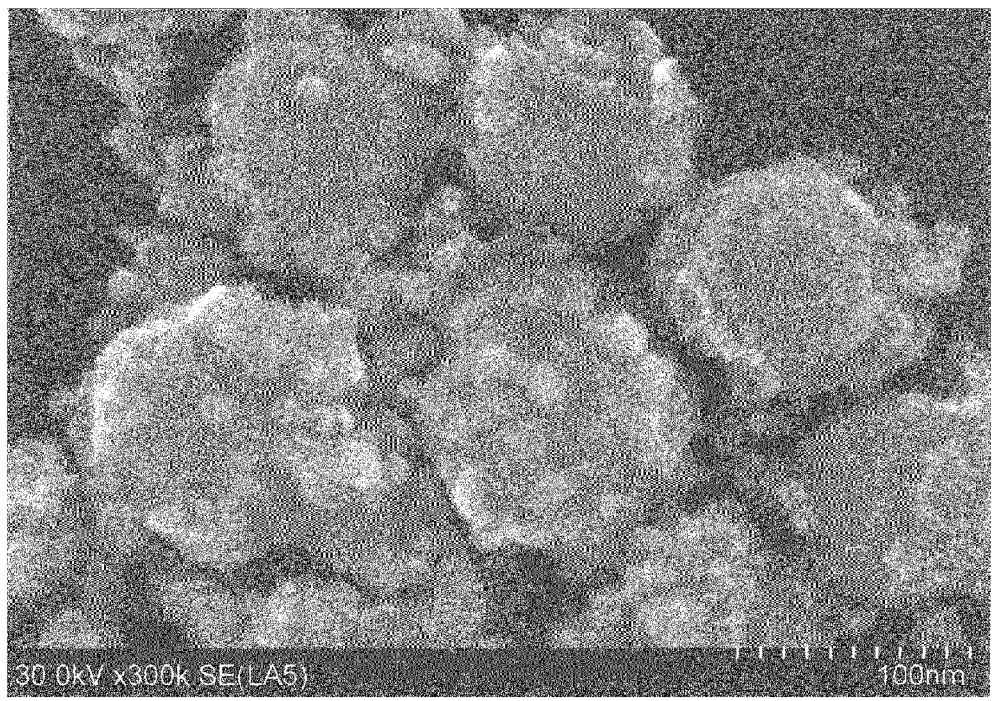
FIG. 13 A SEM image obtained in Comparative Example 7.

As seen in FIG. 13, the silica-based composite particle contained in the dispersion liquid of a silica-based composite particle in Comparative Example 7 caused dropping of the ceria particle (ceria crystal grain) during the disintegration/grinding, when observed under an electron microscope.

Note that it was found that the silica-based composite particles contained in the dispersion liquids of a silica-based composite particle in Examples 1 to 9 caused slight dropping of the ceria particle (ceria crystal grain) during the disintegration/grinding.

The silica-based composite particles in Examples 1 to 9 were found to have the mass ratio of silica and ceria (ceria crystal grain) in the range from 100:11 to 316.

INDUSTRIAL APPLICABILITY

The composite particle of this invention, containing no impurity, is suitably used for polishing the surface of semiconductor devices including semiconductor substrate and wiring board.

The invention claimed is:

1. A dispersion liquid of a silica-based composite particle, containing a silica-based composite particle that has a core particle mainly composed of amorphous silica, and bound thereto a ceria particle mainly composed of crystalline ceria, the ceria particle further having on the surface thereof a silica film, the silica-based composite particle having an average particle size of 50 to 350 nm, and having features [1] to [4] below:
- [1] the silica-based composite particle has a mass ratio of silica and ceria of 100:60 to 316;
- [2] the silica-based composite particle when measured by X-ray diffractometry allows detection of a crystal phase of ceria only;
- [3] the silica-based composite particle when measured by X-ray diffractometry is found to have a crystallite size of crystalline ceria on the (111) plane of 10 to 25 nm; and
- [4] the silica-based composite particle is partially covered with the silica film, wherein the dispersion is designed to give a streaming potential curve when subjected to cation colloidal titration, from which ratio ($\Delta PCD/V$) of the amount of change of streaming potential ($\Delta PCD$), and the amount of consumption (V) of a cation colloidal titrant at a knick, given by Equation (1) below, is determined to be −110.0 to −15.0:

$$\Delta PCD/V=(I-C)/V \quad \text{Equation (1)}$$

where,
- C: streaming potential (mV) at knick; and
- I: streaming potential (mV) at start point of streaming potential curve; and
- V: amount of consumption (ml) of cation colloidal titrant at knick.

2. The dispersion liquid of a silica-based composite particle of claim 1, wherein the silica-based composite particle, when determined by energy dispersive X-ray spectroscopy (EDS) measurement that selectively irradiates electron beam on the silica film observable under a transmission electron microscope, is found to have a ratio of Si atomic percentage relative to Ce atomic percentage (Si atomic percentage/Ce atomic percentage) of 0.9 or larger.

3. The dispersion liquid of a silica-based composite particle of claim 2, wherein the silica-based composite particle contains impurities whose content rates satisfy (a) and (b) below:
- (a) the content rate of each of Na, Ag, Al, Ca, Cr, Cu, Fe, K, Mg, Ni, Ti, Zn and Zr is 100 ppm or below; and
- (b) the content rate of each of U, Th, Cl, $NO_3$, $SO_4$ and F is 5 ppm or below.

4. The dispersion liquid of a silica-based composite particle of claim 2, showing a negative streaming potential before being titrated, when kept within the range from pH 3 to 8.

5. A polishing slurry comprising the dispersion liquid of a silica-based composite particle described in claim 2.

6. The dispersion liquid of a silica-based composite particle of claim 1, wherein the silica-based composite particle contains impurities whose content rates satisfy (a) and (b) below:
- (a) the content rate of each of Na, Ag, Al, Ca, Cr, Cu, Fe, K, Mg, Ni, Ti, Zn and Zr is 100 ppm or below; and
- (b) the content rate of each of U, Th, Cl, $NO_3$, $SO_4$ and F is 5 ppm or below.

7. The dispersion liquid of a silica-based composite particle of claim 6, showing a negative streaming potential before being titrated, when kept within the range from pH 3 to 8.

8. A polishing slurry comprising the dispersion liquid of a silica-based composite particle described in claim 6.

9. The dispersion liquid of a silica-based composite particle of claim 1, showing a negative streaming potential before being titrated, when kept within the range from pH 3 to 8.

10. A polishing slurry comprising the dispersion liquid of a silica-based composite particle described in claim 9.

11. A polishing slurry comprising the dispersion liquid of a silica-based composite particle described in claim 1.

12. The polishing slurry of claim 11, designed to be used for planarizing a semiconductor substrate having a silica film formed thereon.

13. A method of manufacturing a dispersion liquid of a silica-based composite particle, the method comprising Step 1 to Step 3 below:
- Step 1: keeping a silica particle dispersion liquid, having a silica particle dispersed in a solvent, stirred at a temperature of 5 to 98° C., and at a pH of 7.0 to 9.0, and adding thereto a metal cerium salt in a continuous or intermittent manner, to thereby obtain a precursor particle dispersion liquid containing a precursor particle;
- Step 2: drying the precursor particle dispersion liquid, followed by calcination at 400 to 1,200° C., subjecting the obtained calcined product to treatment (i) below, to thereby obtain a dispersion liquid of the disintegrated calcined product:
  - (i) wet disintegration/grinding under addition of a solvent, conducted at pH 8.6 to 10.8,
  and,
- Step 3: centrifuging the dispersion liquid of the disintegrated calcined product at a relative centrifugal acceleration of 300 G or larger, and removing a precipitated component, to thereby obtain a dispersion liquid of a silica-based composite particle.

14. The method of manufacturing a dispersion liquid of a silica-based composite particle of claim 13, wherein the silica-based composite particle contains impurities whose content rates satisfy (a) and (b) below:
- (a) the content rate of each of Na, Ag, Al, Ca, Cr, Cu, Fe, K, Mg, Ni, Ti, Zn and Zr is 100 ppm or below; and
- (b) the content rate of each of U, Th, Cl, $NO_3$, $SO_4$ and F is 5 ppm or below.

* * * * *